US010243070B2

(12) United States Patent
Miyamoto et al.

(10) Patent No.: US 10,243,070 B2
(45) Date of Patent: Mar. 26, 2019

(54) SEMICONDUCTOR DEVICE AND METHOD FOR MANUFACTURING THE SAME

(71) Applicant: Renesas Electronics Corporation, Tokyo (JP)

(72) Inventors: Hironobu Miyamoto, Ibaraki (JP); Yasuhiro Okamoto, Ibaraki (JP); Hiroshi Kawaguchi, Ibaraki (JP); Tatsuo Nakayama, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 101 days.

(21) Appl. No.: 15/463,320

(22) Filed: Mar. 20, 2017

(65) Prior Publication Data

US 2017/0288046 A1 Oct. 5, 2017

(30) Foreign Application Priority Data

Mar. 30, 2016 (JP) .................................. 2016-068017

(51) Int. Cl.

| H01L 21/02 | (2006.01) |
|---|---|
| H01L 29/06 | (2006.01) |
| H01L 29/10 | (2006.01) |
| H01L 29/20 | (2006.01) |
| H01L 29/40 | (2006.01) |
| H01L 29/66 | (2006.01) |
| H01L 21/306 | (2006.01) |
| H01L 29/417 | (2006.01) |

(Continued)

(52) U.S. Cl.
CPC ...... *H01L 29/7787* (2013.01); *H01L 21/0254* (2013.01); *H01L 21/30612* (2013.01); *H01L 29/1033* (2013.01); *H01L 29/1037* (2013.01); *H01L 29/2003* (2013.01); *H01L 29/41775* (2013.01); *H01L 29/66462* (2013.01); *H01L 29/7786* (2013.01); *H01L 29/0657* (2013.01); *H01L 29/402* (2013.01); *H01L 29/42356* (2013.01); *H01L 29/42364* (2013.01)

(58) Field of Classification Search
CPC .......... H01L 29/2003; H01L 29/66462; H01L 29/7786–29/7787; H01L 29/1033–29/1054

See application file for complete search history.

(56) References Cited

U.S. PATENT DOCUMENTS

2014/0209922 A1  7/2014  Ota et al.

FOREIGN PATENT DOCUMENTS

| JP | 2014-146744 A | 8/2014 |
| WO | 2010/064706 A1 | 6/2010 |

*Primary Examiner* — Amar Movva
(74) *Attorney, Agent, or Firm* — Sughrue Mion, PLLC

(57) ABSTRACT

A property of a semiconductor device (high electron mobility transistor) is improved. A semiconductor device having a buffer layer, a channel layer, an electron supply layer, a mesa type cap layer, a source electrode, a drain electrode and a gate insulating film covering the cap layer, and a gate electrode formed on the gate insulating film, is configured as follows. The cap layer and the gate electrode are separated from each other by the gate insulating film, and side surfaces of the cap layer, the side surfaces being closer to the drain electrode and the source electrode, have tapered shapes. For example, a taper angle ($\theta 1$) of the side surface of the cap layer (mesa portion) is equal to or larger than 120 degrees. By this configuration, a TDDB life can be effectively improved, and variation in an ON-resistance can be effectively suppressed.

17 Claims, 33 Drawing Sheets

(51) Int. Cl.
*H01L 29/423* (2006.01)
*H01L 29/778* (2006.01)

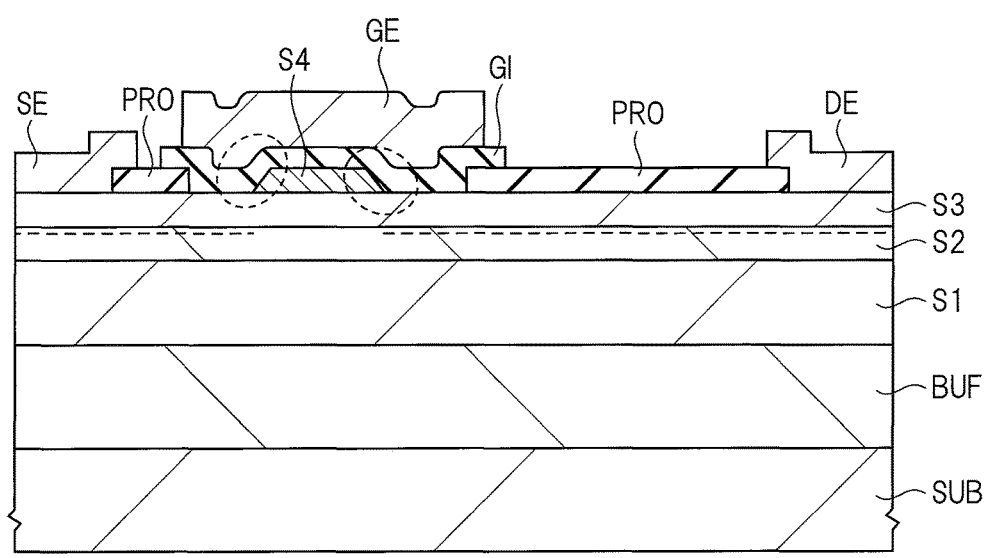
FIG. 16
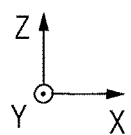

SEMICONDUCTOR DEVICE AND METHOD FOR MANUFACTURING THE SAME

CROSS-REFERENCE TO RELATED APPLICATION

The present application claims priority from Japanese Patent Application No. 2016-68017 filed on Mar. 30, 2016, the content of which is hereby incorporated by reference into this application.

TECHNICAL FIELD OF THE INVENTION

The present invention relates to a semiconductor device, and can be preferably used for, for example, a semiconductor device using a nitride semiconductor.

BACKGROUND OF THE INVENTION

A GaN-based nitride semiconductor has a wider band gap and higher electron mobility than those of Si or GaAs, and therefore, has been expected in application to a transistor for use in high breakdown voltage, high power and high frequency, and has been actively developed in recent years. Among such transistors, a transistor having a normally OFF property is useful, and a configuration for providing the normally OFF property has been examined.

For example, Patent Document 1 (International Publication WO/2010/064706) has disclosed a MIS-type field effect transistor using a group III nitride semiconductor layer, which is turned on by a practical positive gate voltage and can be operated at a high speed.

Moreover, Patent Document 2 (Japanese Patent Application Laid-Open Publication No. 2014-146744) has disclosed a high electron mobility transistor which has a mesa type cap layer (made of p-type GaN or AlGaN) provided with Schottky connection between the cap layer and the gate electrode.

SUMMARY OF THE INVENTION

The present inventors have been engaged in research and development of a semiconductor device using a nitride semiconductor, and have thoroughly examined improvements of properties of the semiconductor device. They have examined a configuration of a transistor (mesa type MOS configuration) for providing the normally OFF property.

However, as will be described later, the property degradation of a gate insulating film has been confirmed in a reliability test (see Comparative Example). Particularly when a film thickness (d) of a gate insulating film is smaller than a film thickness (t) of a mesa portion, the property degradation of the gate insulating film has been significantly observed.

From research of a cause of this degradation, it has been found that electric fields are concentrated onto a processed edge of the mesa portion and both ends of a gate electrode (protruding portions on the lower ends closer to both of a source electrode and a drain electrode), which results in deterioration of the gate insulating film. Note that this phenomenon is completely different from the phenomenon of increase in the On-resistance disclosed in the above-described Patent Document 2. However, countermeasures against the increase in the On-resistance are also required.

Is it desirable to develop a semiconductor device capable of improving a breakdown voltage of a gate insulating film and improving an element property such as an On-resistance reduction by solving these problems.

Other object and novel characteristics of the present invention will be apparent from the description of the present specification and the accompanying drawings.

The typical summary of the embodiments disclosed in the present application will be briefly described as follows.

A semiconductor device shown in one embodiment disclosed in the present application has a configuration in which a buffer layer made of a first nitride semiconductor layer, a channel layer made of a second nitride semiconductor layer and an electron supply layer made of a third nitride semiconductor layer are successively stacked, and which has a cap layer made of a mesa type fourth nitride semiconductor layer formed on the stacked portion. Moreover, the semiconductor device has a source electrode formed on one side of the cap layer, a drain electrode formed on the other side, and a gate electrode formed on the cap layer via a gate insulating film. The cap layer and the gate electrode are separated from each other by the gate insulating film, and the cap layer has a film thickness gradually reduced at its end portion on the drain electrode side and its end portion on the source electrode side.

A method for manufacturing the semiconductor device shown in one embodiment disclosed in the present application has a step of processing the cap layer made of a nitride semiconductor layer into a mesa type layer, and this step includes a step of etching the nitride semiconductor layer and a step of performing a heating treatment on the nitride semiconductor layer. Thus, a side surface of the nitride semiconductor layer is tapered by the above-described heating treatment.

According to the semiconductor device described as the following typical embodiment disclosed in the present application, a property of the semiconductor device can be improved.

According to a method for manufacturing a semiconductor device described as the following typical embodiment disclosed in the present application, a semiconductor device having a favorable property can be manufactured.

BRIEF DESCRIPTIONS OF THE DRAWINGS

FIG. 16 is a cross-sectional view showing a configuration of a semiconductor device of a second embodiment;

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and others), the number of the elements is not limited to a specific number unless otherwise stated or except the case where the number is apparently limited to a specific number in principle. The number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof, and others are mentioned, the substantially approximate and similar shapes and others are included therein unless otherwise stated or except the case where it is conceivable that they are apparently excluded in principle. The same goes for the numerical value and the range described above.

Hereinafter, embodiments will be described in detail with reference to the accompanying drawings. Note that components having the same function are denoted by the same reference symbols throughout all the drawings for describing the embodiment, and the repetitive description thereof will be omitted. When there are a plurality of similar members (portions), an individual or a specific portion is shown by adding a symbol to a generic term character in some cases.

Also, in some drawings used in the embodiments, hatching is omitted even in a cross-sectional view in order to make the drawings easy to see.

Also, in the cross-sectional view, a size of each portion does not correspond to that of the practical device, and the specific portion may be illustrated to be relatively large in order to easily understand the drawings in some cases.

First Embodiment

Hereinafter, a semiconductor device of the present embodiment will be described in detail with reference to the drawings.

[Explanation of Configuration]

Figure 1:
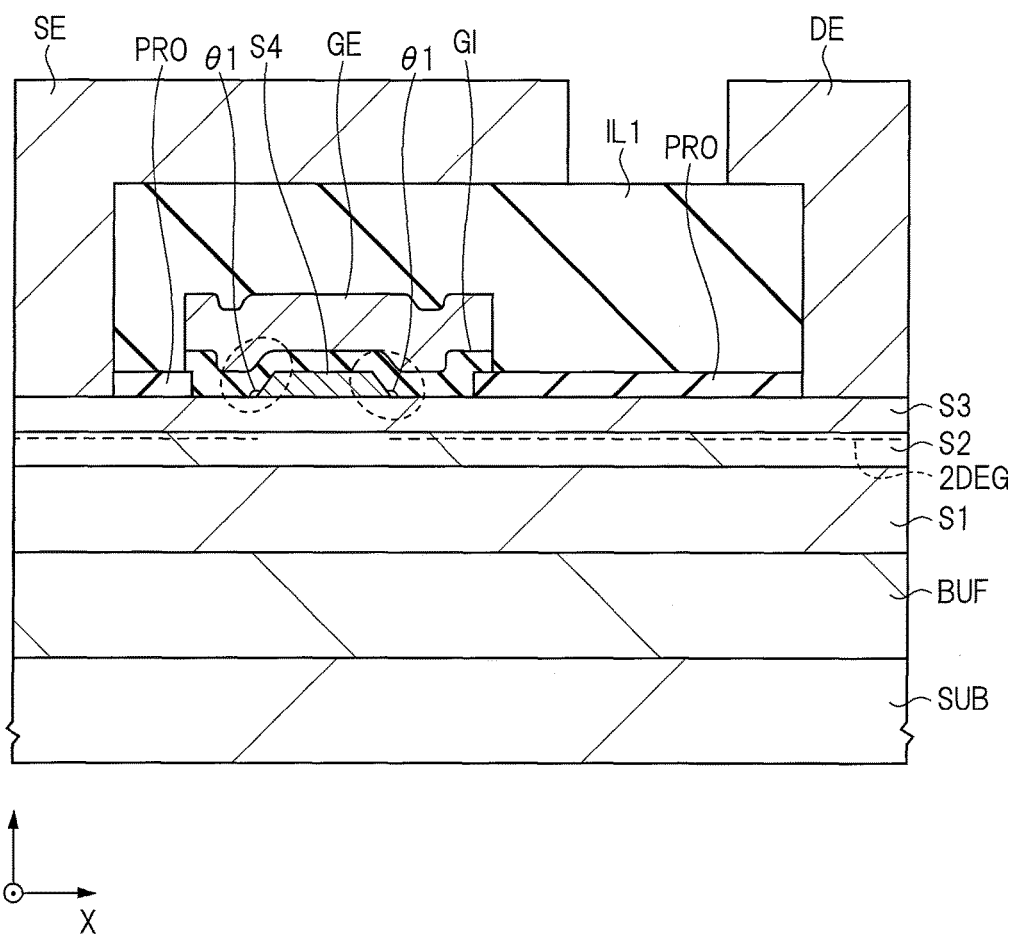
FIG. 1 is a cross-sectional view showing a configuration of a semiconductor device of a first embodiment.

FIG. 1 is a cross-sectional view showing a configuration of a semiconductor device of the present embodiment. The semiconductor device shown in FIG. 1 is a field effect transistor (FET) using a nitride semiconductor. Moreover, the transistor is referred to also as a high electron mobility transistor (HEMI).

In the semiconductor device of the present embodiment, a high resistance buffer layer BUF is provided on a substrate SUB. After a nucleus generation layer is formed on the substrate SUB, note that the high resistance buffer layer BUF may be formed on the formed layer.

As the substrate SUB, for example, a semiconductor substrate made of silicon (Si) whose (111) plane is exposed can be used. As the substrate SUB, not only the substrate made of the above-described silicon but also a substrate made of SiC, sapphire, or others may be used. Moreover, a substrate made of GaN may also be used. In this case, the nucleus generation layer may be omitted.

The nucleus generation layer is made of a nitride semiconductor layer. As the nucleus generation layer, for example, an aluminum nitride (AlN) layer may be used. The high resistance buffer layer BUF is constituted by a single or a plurality of nitride semiconductor layers to which an impurity that forms a deep energy level relative to the nitride semiconductor is added. For example, regarding a superlattice structural body (also referred to as superlattice layer) made of a plurality of nitride semiconductor layers, a superlattice structural body formed by repeatedly stacking a stacked film (AlN/GaN film) composed of a nitride gallium (GaN) layer and an aluminum nitride (AlN) layer can be used as the high resistance buffer layer BUF.

Note that all the nitride semiconductor layers (chemical compound semiconductor layers of III to V group elements) on the substrate SUB are normally formed as a group III element plane growth.

On the high resistance buffer layer BUF, a first nitride semiconductor layer S1, a second nitride semiconductor layer S2 and a third nitride semiconductor layer S3 are successively formed. Moreover, on the center portion of the third nitride semiconductor layer S3, a fourth nitride semiconductor layer S4 is formed.

The second nitride semiconductor layer S2 has an electron affinity that is equal to that of the first nitride semiconductor layer S1, or larger than that of the first nitride semiconductor layer S1 (S1≤S2).

The third nitride semiconductor layer S3 has an electron affinity that is smaller than that of the first nitride semiconductor layer S1 (S1>S3).

The fourth nitride semiconductor layer S4 is a mesa type (mesa-shaped, convex-shaped or line-shaped) layer, and has a side surface having a tapered shape (forward tapered shape). The taper angle (inclination angle: θ1) of the side surface of the mesa type fourth nitride semiconductor layer (referred to also as mesa portion) S4 is an angle located outside the side surface of the mesa portion, and is an angle made by the surface of the third nitride semiconductor layer S3 and the side surface of the fourth nitride semiconductor layer S4. In other words, the angle is made by the surface of the third nitride semiconductor layer S3 exposed between the mesa portion (S4) and a surface protective film PRO described later and the side surface of the fourth nitride semiconductor layer S4. The taper angle (θ1) of the side surface of the mesa portion is 120 degrees or larger.

The fourth nitride semiconductor layer S4 has an electron affinity that is equal to that of the second nitride semiconductor layer S2, or larger than that of the second nitride semiconductor layer S2 (S4≥S2).

The first nitride semiconductor layer S1 is referred to also as a buffer layer, and made of, for example, AlGaN. Moreover, the second nitride semiconductor layer S2 is referred to also as a channel layer, and made of, for example, InGaN. Furthermore, the third nitride semiconductor layer S3 is referred to also as an electron supply layer, and made of, for example, AlGaN. However, the third nitride semiconductor layer S3 is larger than the first nitride semiconductor layer S1 in an Al composition. Moreover, the mesa type fourth nitride semiconductor layer S4 is referred to also as a cap layer, and made of, for example, InGaN. However, the mesa type fourth nitride semiconductor layer S4 is equal to or larger than the second nitride semiconductor layer S2 in an In composition.

Moreover, on the mesa type fourth nitride semiconductor layer (cap layer) S4, a gate electrode GE is formed via a gate insulating film GI. In other words, the gate insulating film GI is formed so as to cover the mesa type fourth nitride semiconductor layer (cap layer) S4. That is, the length of the gate insulating film GI in the X direction (length in a direction of a current flow from the drain electrode to the source electrode, that is, the length in the gate length direction) is larger than the length of the mesa type fourth nitride semiconductor layer (cap layer) S4 in the X direction. For this reason, the mesa type fourth nitride semiconductor layer (cap layer) S4 and the gate electrode GE are separated from each other by the gate insulating film GI. Moreover, the gate insulating film GI is formed on side surfaces on both sides of the mesa type fourth nitride semiconductor layer (cap layer) S4 and an upper surface of the same. Concavity and convexity are formed on the surface of the gate insulating film GI so as to correspond to the shape of the mesa type fourth nitride semiconductor layer (cap layer) S4. The gate electrode GE is formed on the gate insulating film GI. Here, the length of the gate electrode GE in the X direction and the length of the gate insulating film GI in the X direction are the same as each other.

A surface protective film (protective insulating film, insulating film) PRO is formed on both sides of the mesa type fourth nitride semiconductor layer (cap layer) S4 in a part on the third nitride semiconductor layer (electron supply layer) S3. A stacked body formed of the gate insulating film GI and the gate electrode GE is formed so as to cover the mesa type fourth nitride semiconductor layer (cap layer) S4, and so as to overlap with the surface protective film PRO. In other words, the stacked body formed of the gate insulating film GI and the gate electrode GE extends from the upper portion of the surface protective film PRO formed closer to the drain electrode to the upper portion of the surface protective film PRO formed closer to the source electrode. By forming an overlapped region between the gate insulating film GI and the surface protective film PRO in this manner, the distance from the gate electrode to a two dimensional electron gas is made larger, so that the electric field intensity to be applied can be reduced, and the reliability of the gate insulating film can be improved.

On the gate electrode GE and the surface protective film PRO, an interlayer insulating film IL1 is formed.

Moreover, a source electrode SE and a drain electrode DE are formed on both sides of the mesa type fourth nitride semiconductor layer (cap layer) S4 in a part on the third nitride semiconductor layer (electron supply layer) S3. For example, a contact hole is formed inside the stacked film between the surface protective film PRO and the interlayer insulating film IL1, and the source electrode SE and the drain electrode DE are disposed on the inside and upper portions of the contact hole.

In this manner, according to the semiconductor device of the present embodiment, the gate insulating film GI is formed so as to cover the upper surface and side surfaces of the mesa type fourth nitride semiconductor layer (cap layer) S4, and each of the side surfaces of the mesa type fourth nitride semiconductor layer (cap layer) S4 is formed into a tapered shape, and therefore, the life of the TDDB can be effectively improved. Moreover, variation in the ON-resistance can be effectively suppressed.

Figure 2A:
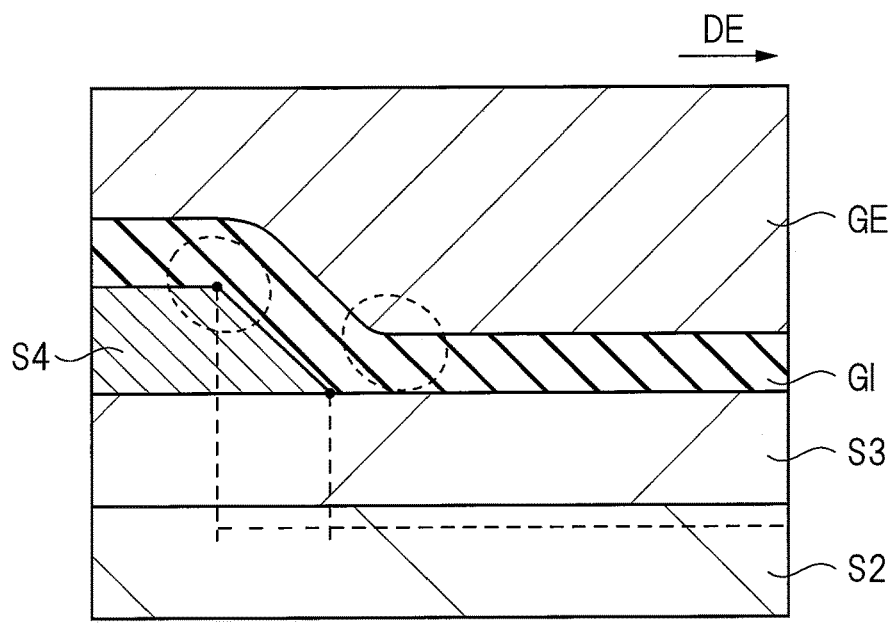
FIG. 2A and FIG. 2B are cross-sectional views showing a configuration in vicinity of a gate insulating film of the semiconductor device of the first embodiment.
Figure 2B:
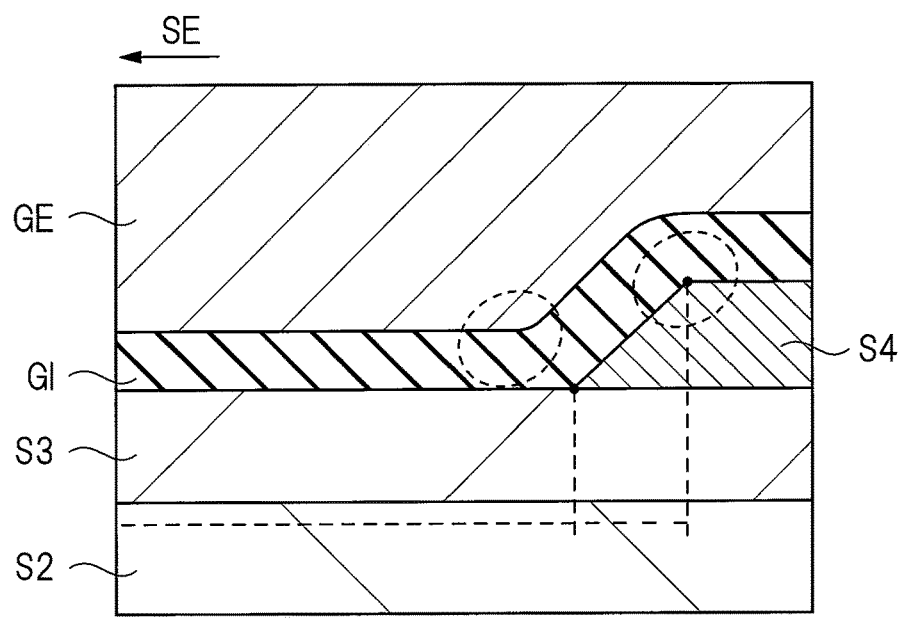
Figure 3:
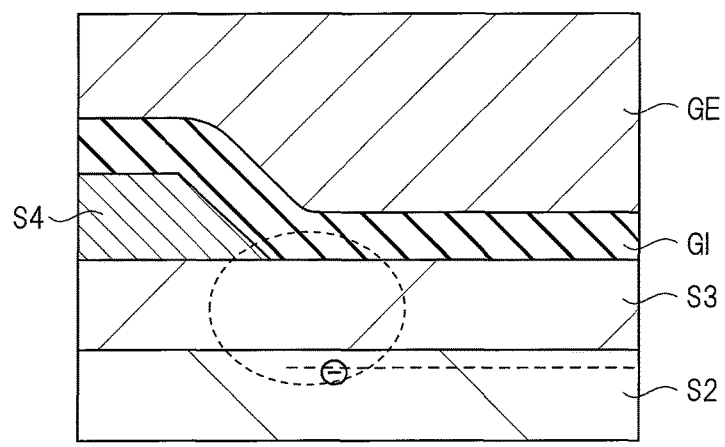
FIG. 3 is a cross-sectional view showing a configuration in vicinity of a gate insulating film of the semiconductor device of the first embodiment.

FIG. 2A, FIG. 2B and FIG. 3 are cross-sectional views showing a configuration in the vicinity of the gate insulating film of the semiconductor device of the present embodiment. FIG. 2A is an enlarged view of vicinity of an end portion of the fourth nitride semiconductor layer (cap layer) S4, the end portion being closer to the drain electrode, and FIG. 2B is an enlarged view of vicinity of an end portion of the fourth nitride semiconductor layer (cap layer) S4, the end portion being closer to the source electrode.

Figure 4:
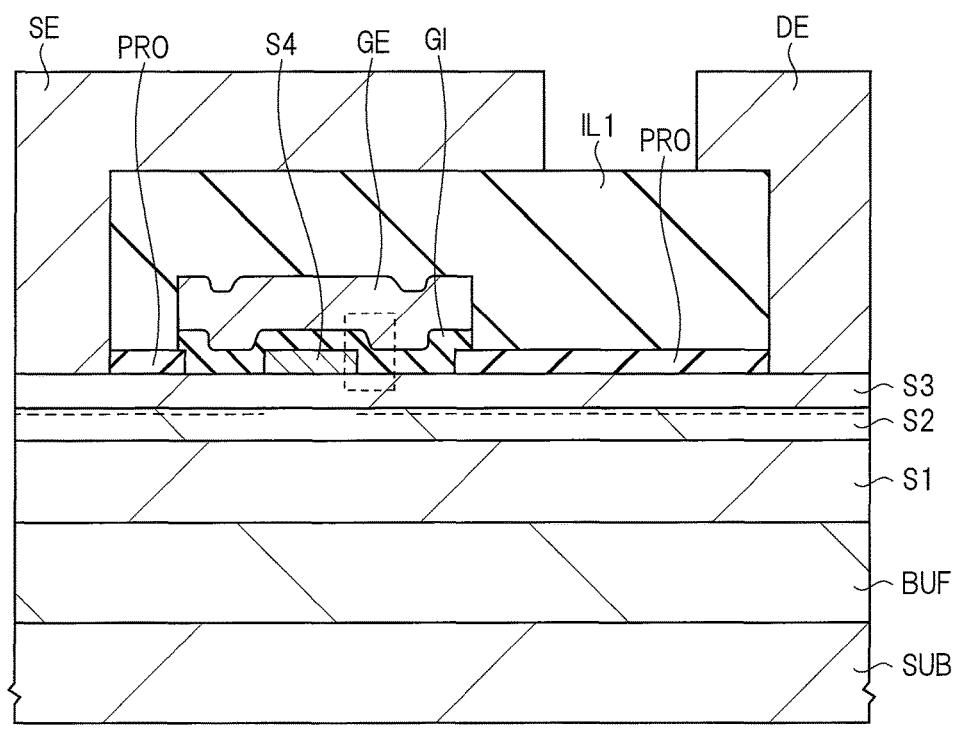
FIG. 4 is a cross-sectional view showing a configuration of a semiconductor device of a comparative example.
Figure 5A:
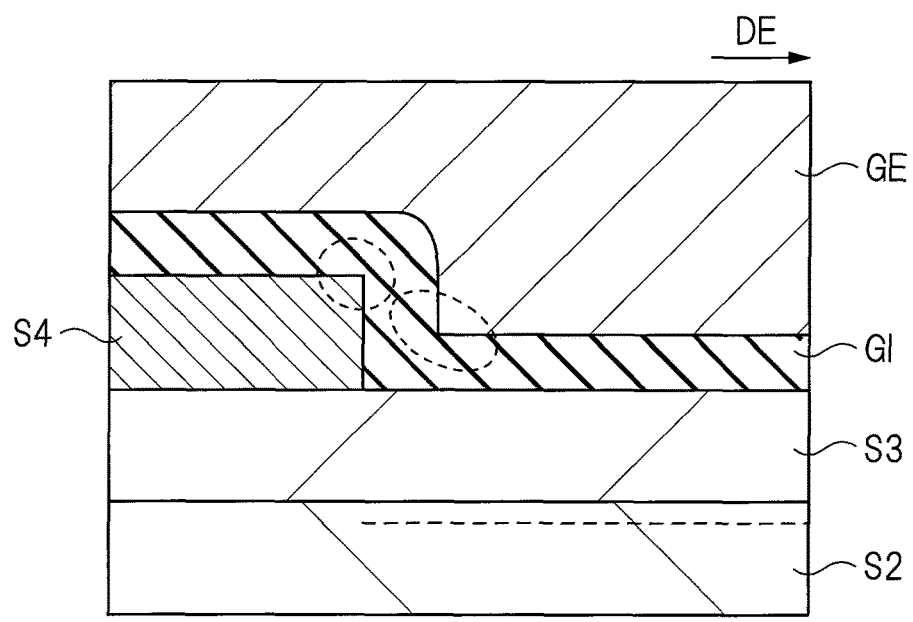
FIG. 5A and FIG. 5B are cross-sectional views showing a configuration in vicinity of a gate insulating film of the semiconductor device of the comparative example.
Figure 5B:
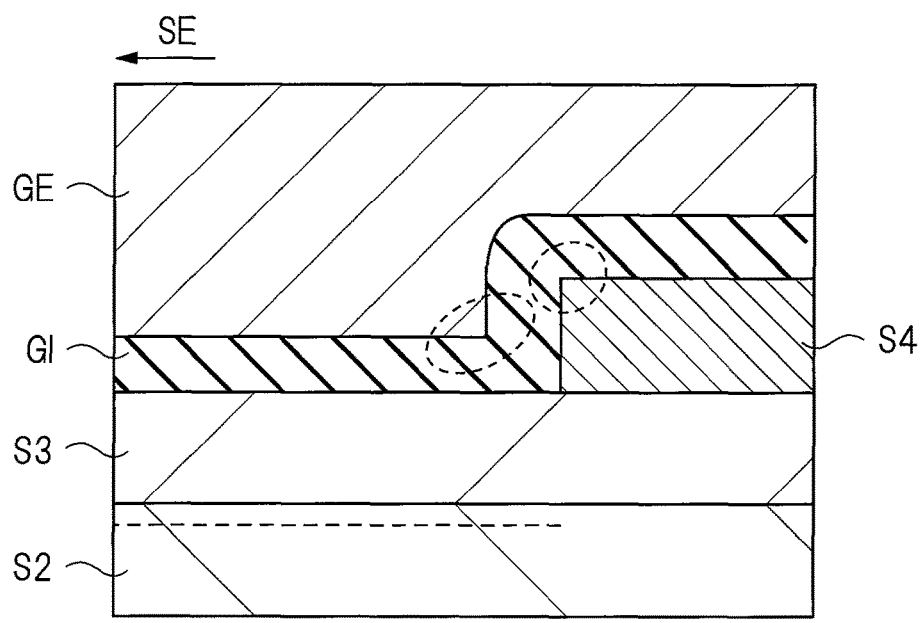
Figure 6:
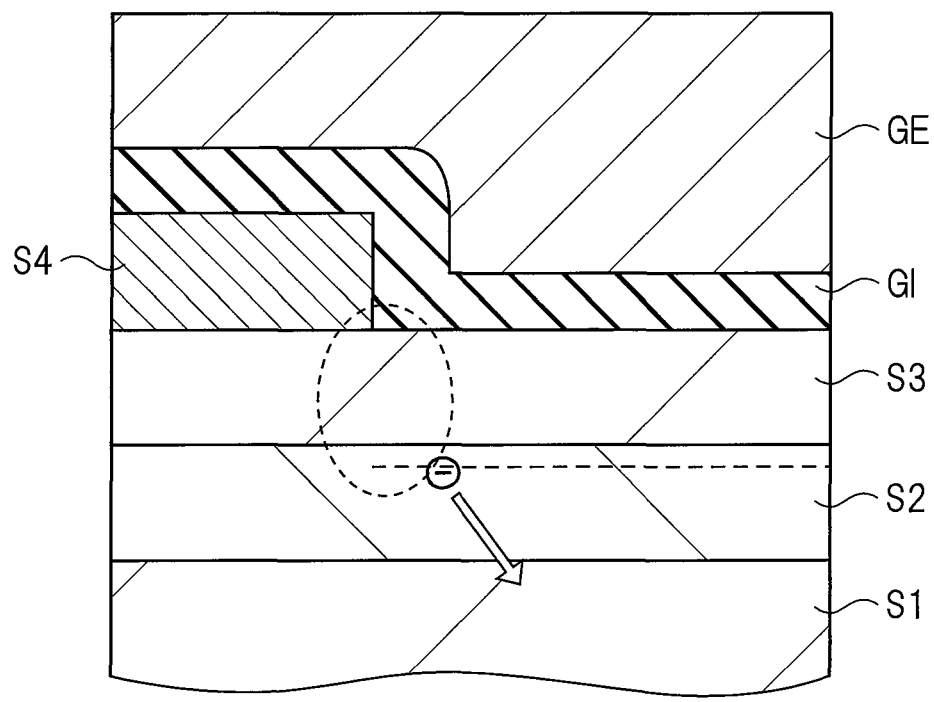
FIG. 6 is a cross-sectional view showing a configuration in vicinity of a gate insulating film of the semiconductor device of the comparative example.

FIG. 4 is a cross-sectional view showing a configuration of a semiconductor device of a comparative example. FIGS. 5A, 5B and FIG. 6 are cross-sectional views showing a configuration in the vicinity of the gate insulating film of the semiconductor device of the comparative example. FIG. 5A is an enlarged view of vicinity of an end portion of the fourth nitride semiconductor layer (cap layer) S4, the end portion being closer to the drain electrode, and FIG. 5B is an enlarged view of vicinity of an end portion of the fourth nitride semiconductor layer (cap layer) S4, the end portion being closer to the source electrode.

(Effect of Improving TDDB Life)

For example, in the semiconductor device of the present embodiment as shown in FIG. 1, FIG. 2A and FIG. 2B, when the potential of the source electrode SE is set to 0V, when the potential of the drain electrode DE is set to 0V, and when the potential of the gate electrode GE is set to +20V which is the rated voltage, the potential of the two-dimensional electron gas 2DEG becomes 0V which is the potentials of the source electrode SE and the drain electrode DE. Therefore, between the gate electrode GE and the two-dimensional electron gas 2DEG in a portion right below the gate electrode GE, a voltage (20V) to be applied to the gate electrode GE is added in a vertical direction. At this time, in the present embodiment, each of the upper and lower portions of the side surface of the mesa type fourth nitride semiconductor layer (cap layer) S4 has a corner portion (a round portion indicated by a broken line in the drawing) having an obtuse angle, so that an electric field concentration onto the gate insulating film GI formed along the side surface of the mesa type fourth nitride semiconductor layer (cap layer) S4 is moderated.

On the other hand, in a semiconductor device of a comparative example shown in FIG. 4, FIG. 5A and FIG. 5B the side surface of the fourth nitride semiconductor layer (cap layer) S4 stands almost vertical, and therefore, each of the upper and lower portions of the side surface of the mesa type fourth nitride semiconductor layer (cap layer) S4 has a corner portion (a round portion indicated by a broken line in the drawing) having an acute angle, so that an electric field is locally concentrated onto the gate insulating film GI formed along the side surface of the fourth nitride semiconductor layer (cap layer) S4. For this reason, in the comparative example, the gate insulating film GI drastically deteriorates to reduce the life of TDDB. Particularly, when the film thickness (t) of the gate insulating film GI relative to the film thickness (d) of the fourth nitride semiconductor layer (cap layer) S4 has a relation of "d>t", the deterioration of the gate insulating film GI has been significantly observed. Therefore, the comparative example has the shorter TDDB life than that of the present embodiment.

Figure 56:
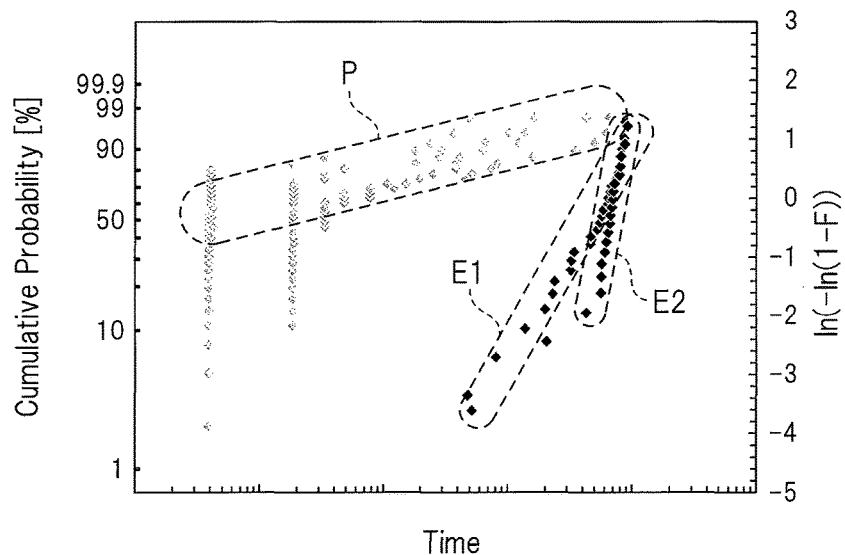
FIG. 56 is a graph showing TDDB evaluation results of the semiconductor devices of the first embodiment, the third embodiment, and the comparative example.

FIG. 56 is a graph showing evaluation results of the TDDB (Time Dependent Dielectric Breakdown) of semiconductor devices of the first embodiment, the third embodiment and the comparative example. A horizontal axis shows time (Time), a vertical axis (on a left side) shows an accumulated failure rate [%], and a vertical axis (on a right side) shows a function of the accumulated failure rate (F). A character "E1" indicates the case of the first embodiment, and a character "P" indicates the case of the comparative example. Note that a character "E2" indicates a case of a third embodiment to be described later. The case (E1) of the present embodiment has the steeper inclination of plots than that of the case (P) of the comparative example. From this fact, it has been found that the case (E1) of the present embodiment is smaller than the case (P) of the comparative example in variation in the breakdown distribution of the gate insulating film. In this manner, also from the data, it has been confirmed that the present embodiment has the effect of improving the TDDB life.

(Effect of Suppressing Variation in ON-Resistance)

For example, in the semiconductor device of the present embodiment shown in FIG. 1 and FIG. 3, consideration is given to a case of occurrence of a potential difference of 400V between the potential of the source electrode SE and the potential of the drain electrode DE, that is, a case of application of such a high voltage therebetween when the potential of the gate electrode GE is set to 0V to provide an OFF state. In such a case, the electric field intensity inside the third nitride semiconductor layer (electron supply layer) S3 closer to the drain electrode DE is moderated since the side surface of the mesa type fourth nitride semiconductor layer (cap layer) S4 has the tapered shape in the present embodiment. Therefore, the injection of electrons into the third nitride semiconductor layer (electron supply layer) S3 and the second nitride semiconductor layer (channel layer) S2 is suppressed (at a round portion indicated by a broken line in the drawing). In this manner, current blocking caused by the injection of electrons is suppressed, and therefore, the voltage of the gate electrode GE is changed from 0V to 10V to turn the transistor from the OFF state to the ON state, and degradation in the ON-resistance of the transistor can be suppressed.

On the other hand, in the semiconductor device of the comparative example shown in FIG. 4 and FIG. 6, an amount of the injection of electrons into the third nitride semiconductor layer (electron supply layer) S3 and the second nitride semiconductor layer (channel layer) S2 is large, and therefore, degradation in the ON-resistance of the transistor cannot be suppressed (at around portion indicated by a broken line in the drawing).

For example, when the potential of the gate electrode GE is set to 0V and the potential difference between the source electrode SE and the drain electrode DE is set to 400V, the amount of increase of the resistance value between before and after the setting is 2.0 times in the case of the comparative example, while it is 1.2 times in the case of the semiconductor device of the present embodiment. In this manner, also from the data, it has been confirmed that the variation in the ON-resistance can be suppressed in the present embodiment.

[Explanation of Manufacturing Method]

Next, with reference to FIG. 7 to FIG. 15, a method for manufacturing a semiconductor device of the present embodiment will be described, and the configuration of the semiconductor device will be more clearly described. FIG. 7 to FIG. 15 are cross-sectional views showing the manufacturing processes of the semiconductor device of the present embodiment.

Figure 7:
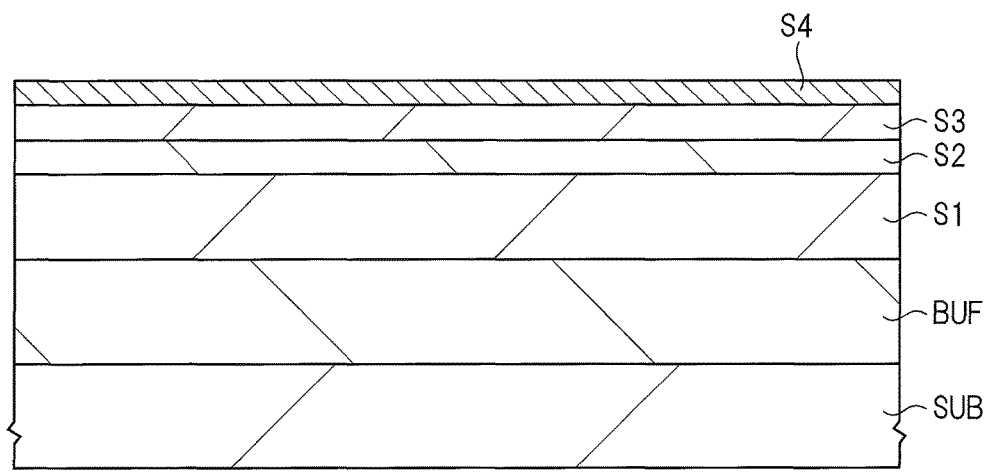
FIG. 7 is a cross-sectional view showing a manufacturing step of the semiconductor device of the first embodiment.

As shown in FIG. 7, after a nucleus generation layer (not shown) is formed on a substrate SUB, a high resistance buffer layer BUF is formed thereon. As the substrate SUB, for example, a semiconductor substrate made of silicon (Si) whose (111) plane is exposed is used. On the substrate, as the nucleus generation layer, for example, an aluminum nitride (AlN) layer is epitaxially grown with a thickness of about 200 nm by using a metal organic chemical vapor deposition (MOCVD) method or others.

As the substrate SUB, note that not only the substrate made of the above-described silicon but also a substrate made of SiC, sapphire or others may be used. Moreover, a substrate made of GaN may also be used. In this case, the nucleus generation layer may be omitted. Note that all the nucleus generation layer and the nitride semiconductor layers (chemical compound semiconductor layers of III to V group elements) formed after the nucleus generation layer are normally formed as the group III element plane growth (that is, in the present case, gallium plane or aluminum plane growth).

Next, on the nucleus generation layer, a superlattice structural body formed by repeatedly stacking a stacked film (AlN/GaN film) composed of a nitride gallium (GaN) layer and an aluminum nitride (AlN) layer is formed as the high resistance buffer layer BUF. For example, a gallium nitride (GaN) layer having a film thickness of about 20 nm and an aluminum nitride (AlN) layer having a film thickness of about 5 nm are epitaxially grown alternately by a metal organic chemical vapor deposition method or others. For example, 40 layers of the above-described stacked film are formed. On this superlattice structural body, for example, an AlGaN layer is epitaxially grown as a part of the high resistance buffer layer BUF by a metal organic chemical vapor deposition method or others. The film thickness of the AlGaN layer is set to, for example, about 1 μm.

Next, on the high resistance buffer layer BUF, as a first nitride semiconductor layer (buffer layer) S1, an AlGaN layer is epitaxially grown with a thickness of about 1000 nm by using a metal organic chemical vapor deposition method or others. When the constituent element ratio of the AlGaN layer is expressed as, for example, $Al_XGa_{1-X}N$, a term "X" is set to 0 or larger and 0.1 or smaller ($0 \leq X \leq 0.1$).

Next, on the first nitride semiconductor layer S1, an InGaN layer is epitaxially grown with a thickness of about 50 nm as a second nitride semiconductor layer (channel layer) S2 by using a metal organic chemical vapor deposition method or others. When the constituent element ratio of the InGaN layer is expressed as, for example, $In_YGa_{1-Y}N$, a term "Y" is set to 0 or larger and 0.05 or smaller ($0 \leq Y \leq 0.05$).

Next, on the second nitride semiconductor layer S2, an AlGaN layer is epitaxially grown with a thickness of about 20 nm as a third nitride semiconductor layer (electron supply layer) S3 by using a metal organic chemical vapor deposition method or others. When the constituent element ratio of the AlGaN layer is expressed as, for example, $Al_ZGa_{1-Z}N$, a term "Z" is set to be larger than "X" and smaller than 0.4 ($X < Z < 0.4$).

Next, on the third nitride semiconductor layer S3, an InGaN layer is epitaxially grown with a thickness of about 100 nm as a fourth nitride semiconductor layer (cap layer) S4 by using a metal organic chemical vapor deposition method or others. When the constituent element ratio of the InGaN layer is expressed as, for example, $In_\alpha Ga_{1-\alpha}N$, a term "α" is set to Y or larger and smaller than 0.05 ($Y \leq \alpha < 0.05$).

The first to fourth nitride semiconductor layers S1 to S4 are grown while, for example, a carrier gas and a material gas are introduced into an apparatus. As the material gas, a gas containing a constituent element of the nitride semiconductor layer (in this case, AlGaN layer or InGaN layer) is used. For example, when the AlGaN layer is formed, trimethyl aluminum (TMAl), trimethyl gallium (TMG) and ammonia are used as material gases for Al, Ga and N, respectively. Moreover, for example, when the InGaN layer is formed, trimethyl indium (TMI), trimethyl gallium (TMG) and ammonia are used as material gases for In, Ga and N, respectively. In this manner, according to the epitaxial growth method, the constituent element ratio of each layer can be easily accurately adjusted by adjusting the flow rate of the material gases. Moreover, according to the epitaxial growth method, the layers having different element compositions can be easily continuously formed by switching the material gases.

Figure 8:
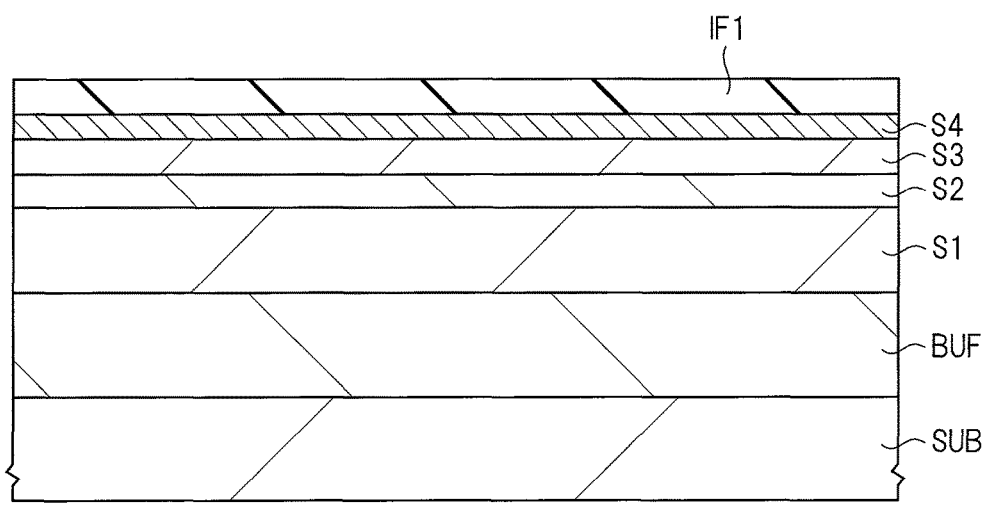
FIG. 8 is a cross-sectional view showing a manufacturing step of the semiconductor device of the first embodiment.

Next, as shown in FIG. 8, on the fourth nitride semiconductor layer S4, a silicon nitride film is deposited with a thickness of about 100 nm as an insulating film IF1 by using a plasma CVD method or others.

Figure 9:
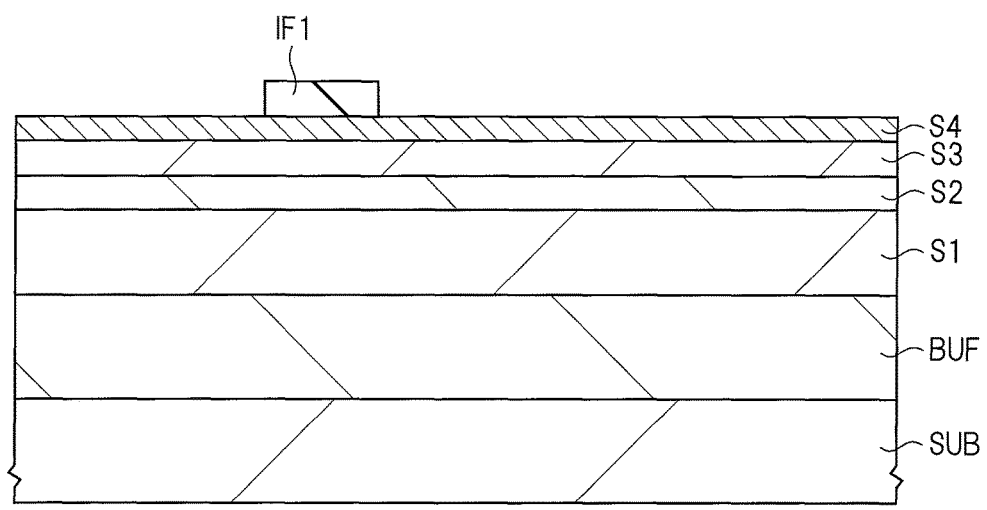
FIG. 9 is a cross-sectional view showing a manufacturing step of the semiconductor device of the first embodiment.

Next, as shown in FIG. 9, the insulating film IF1 is processed by using photolithography and etching techniques. That is, a photoresist film (not shown) is formed on the insulating film IF1, and the photoresist film is left only on the formation region of the mesa type fourth nitride semiconductor layer (cap layer) S4. Next, the insulating film IF1 is etched by using this photoresist film as a mask. Then, the photoresist film is removed.

Figure 10:
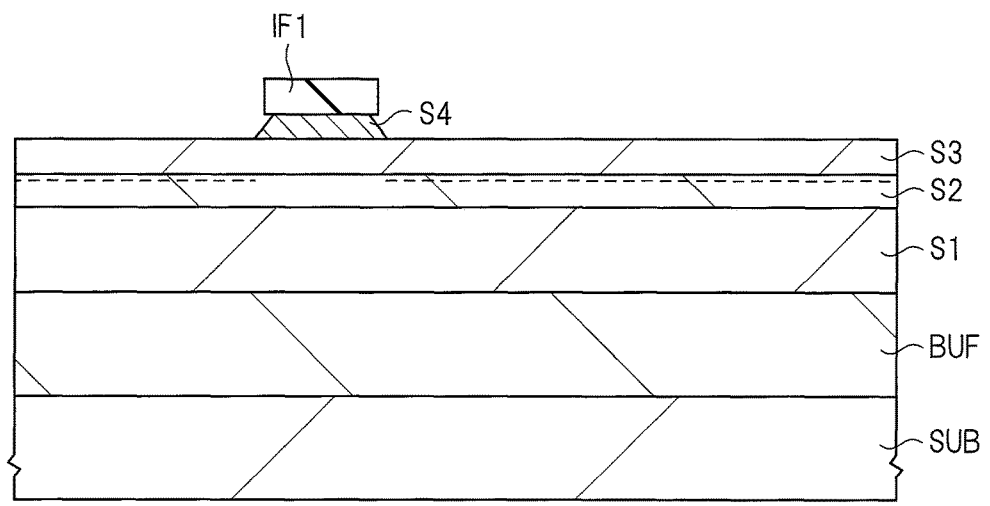
FIG. 10 is a cross-sectional view showing a manufacturing step of the semiconductor device of the first embodiment.

Next, as shown in FIG. 10, by using the insulating film IF1 as a mask, the fourth nitride semiconductor layer S4 is etched (FIG. 10). For example, by a dry etching process using a chlorine-based gas, the fourth nitride semiconductor layer S4 is processed. The etching of the lower layer film by using a film having a desired shape as a mask as described above is referred to as patterning. Incidentally, by adding a fluorine-based gas to the chlorine-based gas, the etching selection ratio between the third nitride semiconductor layer S3 and the fourth nitride semiconductor layer S4 is increased, so that the etching controllability is improved.

Next, by performing a heating process thereon, the side surface of the fourth nitride semiconductor layer S4 is formed into a tapered shape. For example, as the heating process, a heating process at 600° C. for about 10 minutes is performed in a nitrogen atmosphere. For example, the tapered angle (80 to 90 degrees) after the above-described dry etching is changed into a tapered angle of about 120 degrees after the above-described heating process.

Here, the heating process is performed as the taper forming process on the side surface of the fourth nitride semiconductor layer S4. However, a wet etching process may be performed. That is, by performing the wet etching process in place of the heating process, the side surface of the fourth nitride semiconductor layer S4 is formed into a tapered shape. For example, the layer is made in contact with an alkali-based etching solution (for example, KHO, TMAH (tetramethyl ammonium hydroxide) or others). For example, the temperature of the etching solution is set to 60° C., and the etching time (contact time) is set to about 10 minutes. For example, the tapered angle (80 to 90 degrees) after the above-described dry etching is changed into a tapered angle of about 130 to 170 degrees after the above-described wet etching process. The wet etching is easier to expose a crystal plane than the dry etching, and therefore, the side surface can be formed into a tapered shape by the wet etching.

In this manner, by using the two processes of the dry etching and the heating process or the dry etching and the wet etching, the fourth nitride semiconductor layer S4 may be processed. Moreover, the fourth nitride semiconductor layer S4 may be patterned by performing a dry etching process having a larger isotropic component to form the tapered-shape side surface. In order to make the isotropic component larger at the time of the dry etching, such methods as decrease in a substrate bias or increase in a discharging pressure are proposed.

Moreover, on the side surface of the fourth nitride semiconductor layer S4 after the wet etching or the dry etching process with high isotropic component, a "(10-12) r" plane and a "(11-23) n" plane are easily exposed. The tapered angles of these planes are about 130 degrees to 160 degrees. In this manner, the tapering process by etching provides an angle close to a preferable tapered angle in the present embodiment.

Figure 11:
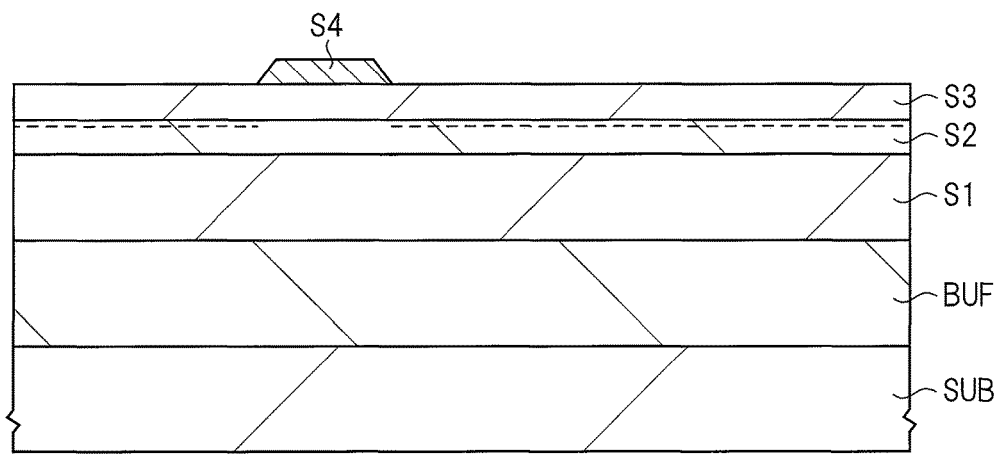
FIG. 11 is a cross-sectional view showing a manufacturing step of the semiconductor device of the first embodiment.

Next, as shown in FIG. 11, the insulating film IF1 on the mesa type fourth nitride semiconductor layer S4 is removed. For example, the insulating film IF1 is removed by dry etching or wet etching.

Next, a surface protective layer PRO is formed on the mesa type fourth nitride semiconductor layer (cap layer) S4 and the third nitride semiconductor layer (electron supply layer) S3. For example, as the surface protective film PRO, a silicon nitride film is deposited with a thickness of about 100 nm by using a plasma CVD method or others. As the surface protective film PRO, not only the silicon nitride film (SiN film) but also a silicon oxide film ($SiO_2$ film), silicon oxynitride film (SiON film), an aluminum oxide film ($Al_2O_3$) or others may be used. Although the method for forming these insulating films is not particularly limited, the above-described silicon oxide film can be formed by using, for example, a thermal CVD method. Moreover, the above-described aluminum oxide film can be formed by using, for example, an ALD (Atomic Layer Deposition) method.

Figure 12:
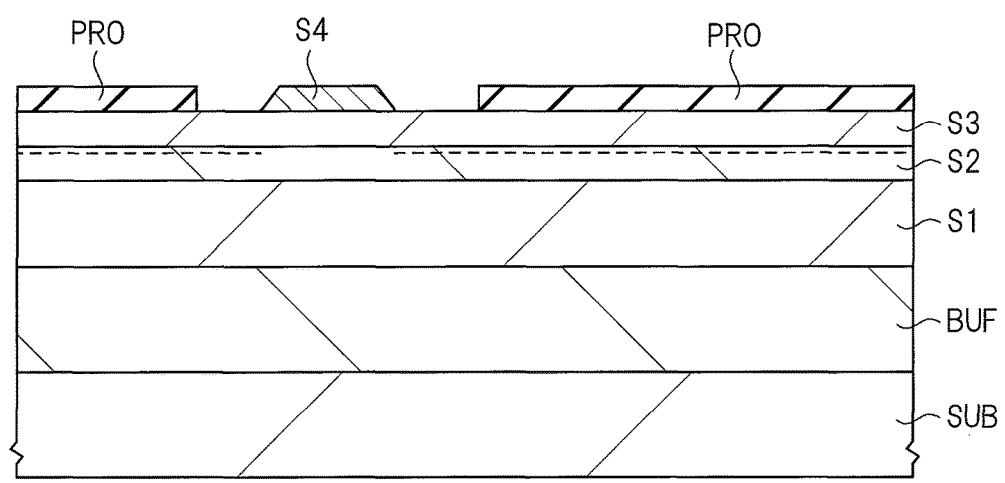
FIG. 12 is a cross-sectional view showing a manufacturing step of the semiconductor device of the first embodiment.

Next, the surface protective film PRO on the mesa type fourth nitride semiconductor layer (cap layer) S4 is removed. For example, by using a photoresist film (not shown) having an opening located on the upper portion of the mesa type fourth nitride semiconductor layer (cap layer) S4 as a mask, the surface protective film PRO is etched, the surface protective film PRO being located on the upper portion of the mesa type fourth nitride semiconductor layer (cap layer) S4 and on partial regions of the third nitride semiconductor layer (electron supply layer) S3 on both sides of the mesa type fourth nitride semiconductor layer (cap layer) S4 (FIG. 12). Thus, the upper portion of the mesa type fourth nitride semiconductor layer (cap layer) S4 and the partial regions of the third nitride semiconductor layer (electron supply layer) S3 on both sides of the mesa type fourth nitride semiconductor layer (cap layer) S4 are exposed. In this manner, the mesa type fourth nitride semiconductor layer (cap layer) S4 and the surface protective film PRO on the right side (closer to the drain electrode) in the drawing are separated from each other, and the third nitride semiconductor layer (electron supply layer) S3 is exposed between them. Moreover, the mesa type fourth nitride semiconductor layer (cap layer) S4 and the surface protective film PRO on the left side (closer to the source electrode) in the drawing are separated from each other, and the third nitride semiconductor layer (electron supply layer) S3 is exposed between them. Next, the photoresist film is removed.

Figure 13:
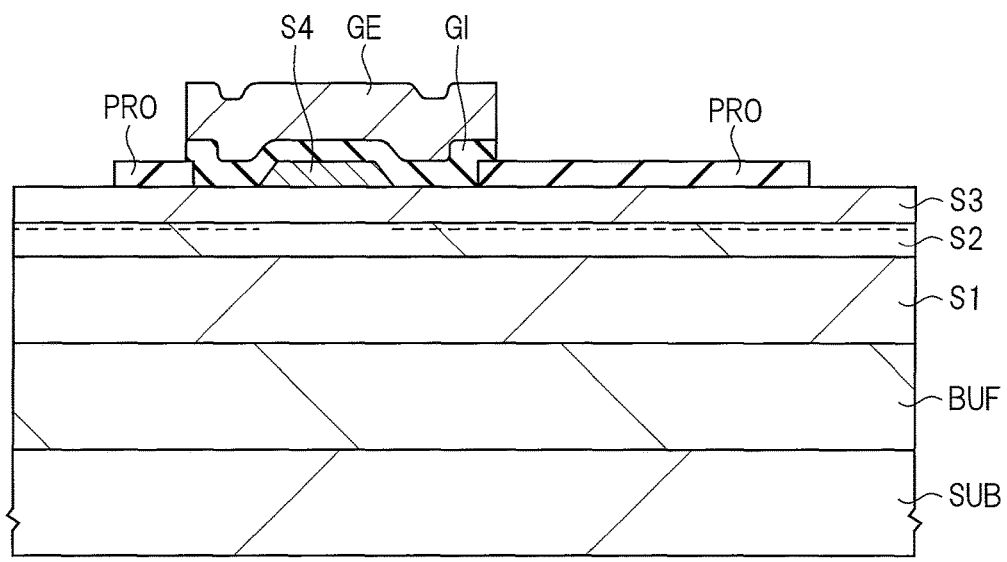
FIG. 13 is a cross-sectional view showing a manufacturing step of the semiconductor device of the first embodiment.

Next, as shown in FIG. 13, on the mesa type fourth nitride semiconductor layer (cap layer) S4, a gate electrode GE is formed via a gate insulating film GI. For example, on the surface protective film PRO including the upper portion of the mesa type fourth nitride semiconductor layer (cap layer) S4 and the exposed portions of the third nitride semiconductor layer (electron supply layer) S3 on both sides thereof, an aluminum oxide film ($Al_2O_3$ film) is deposited with a film thickness of about 50 nm as the gate insulating film GI by using an ALD method or others.

As the gate insulating film GI, not only the aluminum oxide film but also a silicon oxide film or a high dielectric constant film having a higher dielectric constant than that of the silicon oxide film may be used. As the high dielectric constant film, a SiN film, a SiON film (silicon oxynitride film), a ZrO$_2$ film (zirconium oxide film), or a hafnium-based insulating film such as a HfO$_2$ film (hafnium oxide film), a hafnium aluminate film, a HfON film (hafnium oxynitride film), a HfSiO film (hafnium silicate film), a HfSiON film (hafnium silicon oxynitride film) and a HfAlO film, may be used.

Next, for example, on the gate insulating film GI, as a conductive film (a constituent material for the gate electrode GE), for example, a TiN (titanium nitride) film is deposited with a film thickness of about 200 nm by using a sputtering method or others. The constituent material and film thickness of the gate electrode GE can be appropriately adjusted. As the gate electrode GE, not only TiN but also polycrystal silicon to which a dopant such as B or P is added may be used. Moreover, Ti, Al, Ni, Pt, Au, a Si compound of them, or an N compound of them may be used. Moreover, a multilayer film formed by stacking these material layers may be used.

Next, a photoresist film (not shown) is formed in a gate electrode formation region by using a photolithography technique, and a gate electrode GE is formed by etching the TiN film by using this photoresist film as a mask. The TiN film is etched by, for example, dry etching using a gas containing Cl$_2$ as a main component. Thereafter, the photoresist film is removed. In place of the chlorine-based gas such as Cl$_2$, a fluorine-based gas may be used. Moreover, a mixed gas of the chlorine-based gas with the fluorine-based gas may be used. Next, an aluminum oxide film in the lower layer of the gate electrode (TiN film) GE is etched. The aluminum oxide film is etched by, for example, using dry etching using a gas containing BCl$_3$ as a main component. Next, the above-described photoresist film is removed. When this gate electrode GE and the gate insulating film GI are processed, note that they are processed so that the end portion of the stacked film of the gate electrode GE and the gate insulating film GI is overlapped with the surface protective film PRO. That is, the stacked film of the gate electrode GE and the gate insulating film GI is formed so as to cover the upper portion of the mesa type fourth nitride semiconductor layer (cap layer) S4 and the exposed portions of the third nitride semiconductor layer (electron supply layer) S3 located on both sides thereof.

Figure 14:
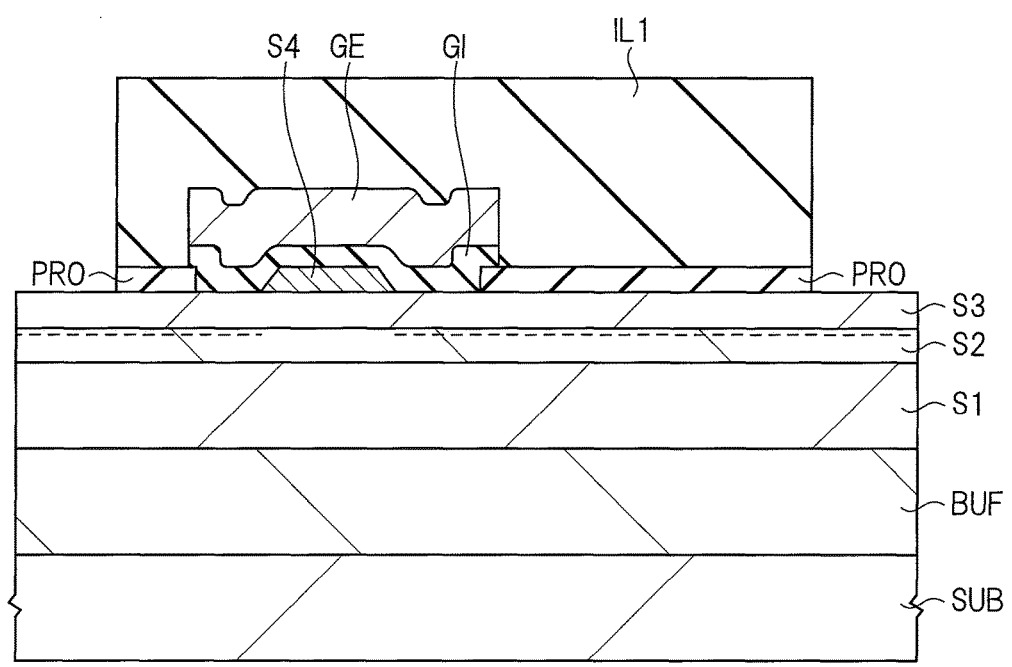
FIG. 14 is a cross-sectional view showing a manufacturing step of the semiconductor device of the first embodiment.

Next, as shown in FIG. 14, an interlayer insulating film IL1 is formed on the gate electrode GE and the surface protective film PRO. For example, as the interlayer insulating film IL1, a silicon oxide film is deposited with a thickness of about 2 μm by using a CVD method or others. As the silicon oxide film, a so-called TEOS film formed by using tetraethyl orthosilicate as a raw material may be used. Next, by using photolithography and etching techniques, a contact hole is formed in the interlayer insulating film IL1. For example, on the interlayer insulating film IL1, a photoresist film (not shown) having openings respectively in a source electrode connection region and a drain electrode connection region is formed. Next, a contact hole is formed by etching the interlayer insulating film IL1 and the surface protective film PRO while using this photoresist film as a mask. The interlayer insulating film IL1 is etched by, for example, dry etching using a gas (fluorine-based gas) containing SF$_6$ as a main component. Thus, the third nitride semiconductor layer (electron supply layer) S3 in the source electrode connection region and the drain electrode connection region located on both sides of the gate electrode GE is exposed.

Figure 15:
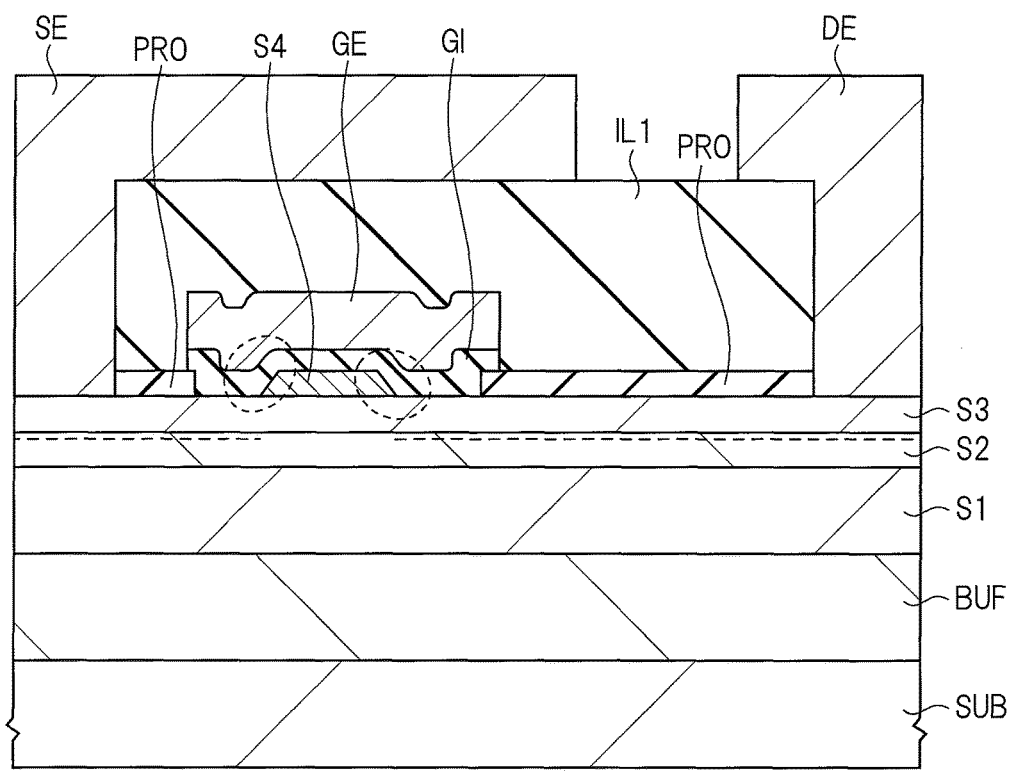
FIG. 15 is a cross-sectional view showing a manufacturing step of the semiconductor device of the first embodiment.

Next, as shown in FIG. 15, a source electrode SE and a drain electrode DE are formed in the contact hole and on the interlayer insulating film IL1. For example, a conductive film is formed on the interlayer insulating film IL1 including the inside of the contact hole. For example, as the conductive film, an Al/Ti film is formed. For example, on the interlayer insulating film IL1 including the inside of the contact hole, a Ti film is formed with a film thickness of about 20 nm by using a sputtering method or others. Further, on this, an Al film is formed with a film thickness of about 2 μm by a sputtering method or others. Next, a heating process is performed. For example, a heating process at 500° C. for 30 minutes is performed. Thus, an ohmic contact between the conductive film (Al/Ti film) and the lower layer thereof can be made.

Next, a photoresist film (not shown) is formed on the formation regions of the source electrode SE and the drain electrode DE, and the conductive film (Al/Ti film) is etched by using this photoresist film (not shown) as a mask. For example, the conductive film (Al/Ti film) is etched by dry etching using a gas containing Cl$_2$ as a main component.

The constituent material and film thickness of the conductive film forming the source electrode SE and drain electrode DE can be appropriately adjusted. As such a conductive film, a material that is made in ohmic contact with the nitride semiconductor layer is preferably used.

Thereafter, an insulating film is formed on the interlayer insulating film IL1 including the upper portions of the source electrode SE and drain electrode DE, and upper layer wirings may be further formed. Moreover, on the uppermost layer wiring, a protective film made of an insulating film may be formed.

By using the above-described processes, the semiconductor device of the present embodiment can be formed. Note that the above-described processes are described as one example, and the semiconductor device of the present embodiment may be manufactured by using processes other than the above-described processes.

Second Embodiment

In the first embodiment, the gate electrode GE, the source electrode SE and the drain electrode DE are formed by using so-called photolithography and etching techniques. However, these electrodes may be formed by using a so-called lift-off method.

[Explanation of Configuration]

FIG. 16 is a cross-sectional view showing a configuration of a semiconductor device of the present embodiment. Configurations except for the source electrode SE and the drain electrode DE are the same as those of the semiconductor device described in the first embodiment (FIG. 1).

In the present embodiment, a gate electrode GE is formed via a gate insulating film GI on the fourth nitride semiconductor layer (cap layer) S4, and a surface protective film PRO is formed on both sides of the fourth nitride semiconductor layer (cap layer) S4. Moreover, a source electrode SE and a drain electrode DE are formed in parts on both sides of the fourth nitride semiconductor layer (cap layer) S4, the parts being on the third nitride semiconductor layer (electron supply layer) S3. For example, the surface protective film PRO in the formation regions of the source electrode SE and the drain electrode DE is removed, so that the third nitride semiconductor layer (electron supply layer) S3 is exposed. On the exposed third nitride semiconductor layer (electron supply layer) S3, the source electrode SE and the drain electrode DE are formed.

In this manner, the semiconductor device of the present embodiment has manufacturing processes different from those of the first embodiment, and therefore, is different from the semiconductor device of the first embodiment in that the length of the gate insulating film GI in the X direction is larger than the length of the gate electrode GE in the X direction and in that the source electrode SE and the drain electrode DE are not disposed inside the interlayer insulating film.

However, also in the semiconductor device of the present embodiment, the gate insulating film GI is formed so as to cover the upper surface and side surface of the fourth nitride semiconductor layer (cap layer) S4, and the side surface of the fourth nitride semiconductor layer (cap layer) S4 is formed into a tapered shape, and therefore, the TDDB life can be effectively improved as explained in the first embodiment in detail. Moreover, the variation in the ON resistance can be effectively suppressed.

[Explanation of Manufacturing Method]

Next, with reference to FIG. 17 to FIG. 25, a method for manufacturing a semiconductor device of the present embodiment will be described, and the configuration of the semiconductor device will be more clearly described. FIG. 17 to FIG. 25 are cross-sectional views showing the manufacturing processes of the semiconductor device of the present embodiment.

For example, as similar to the case of the first embodiment, a nucleus generation layer (not shown), a high resistance buffer layer BUF, a first nitride semiconductor layer (buffer layer) S1, a second nitride semiconductor layer (channel layer) S2 and a third nitride semiconductor layer (electron supply layer) S3 are successively formed on a substrate SUB.

Figure 17:
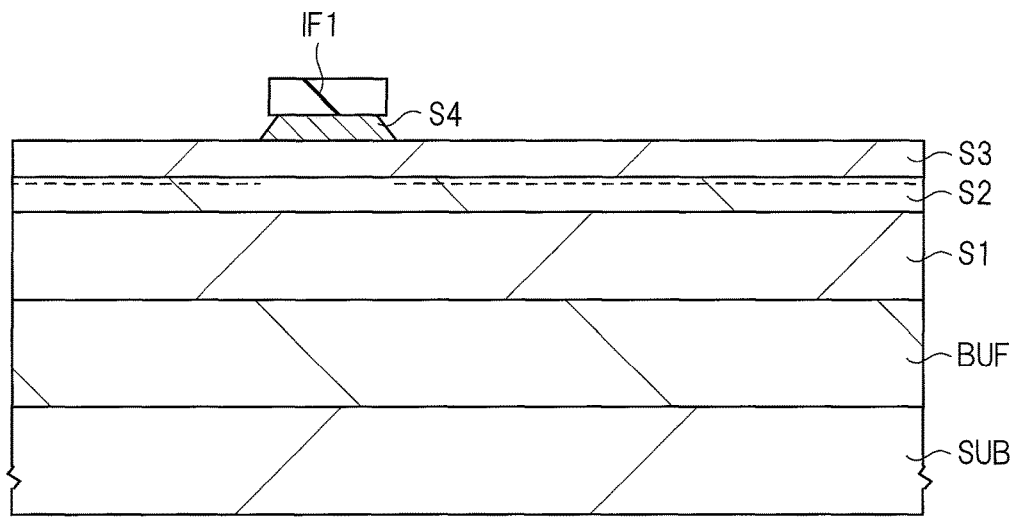
FIG. 17 is a cross-sectional view showing a manufacturing step of the semiconductor device of the second embodiment.
Figure 18:
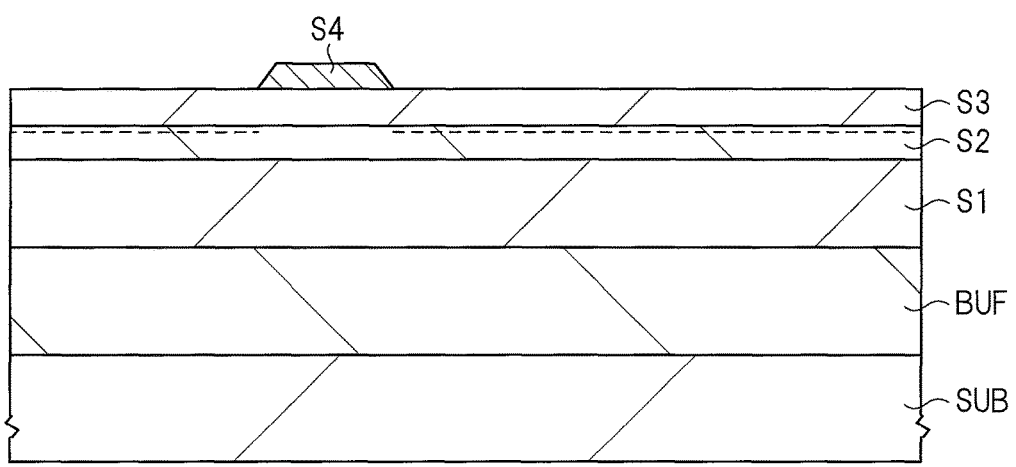
FIG. 18 is a cross-sectional view showing a manufacturing step of the semiconductor device of the second embodiment.

Next, as similar to the case of the first embodiment, after the fourth nitride semiconductor layer (cap layer) S4 is formed on the third nitride semiconductor layer S3, the fourth nitride semiconductor layer (cap layer) S4 is processed into a mesa type by using photolithography and etching techniques or others. For example, as similar to the first embodiment, after the fourth nitride semiconductor layer (cap layer) S4 is etched by using the insulating film IF1 as a mask, a heating process is performed (FIG. 17). Next, the insulating film IF1 is removed (FIG. 18). In this manner, the fourth nitride semiconductor layer (cap layer) S4 having the side surface formed into a tapered shape as explained in the first embodiment in detail can be formed.

Figure 19:
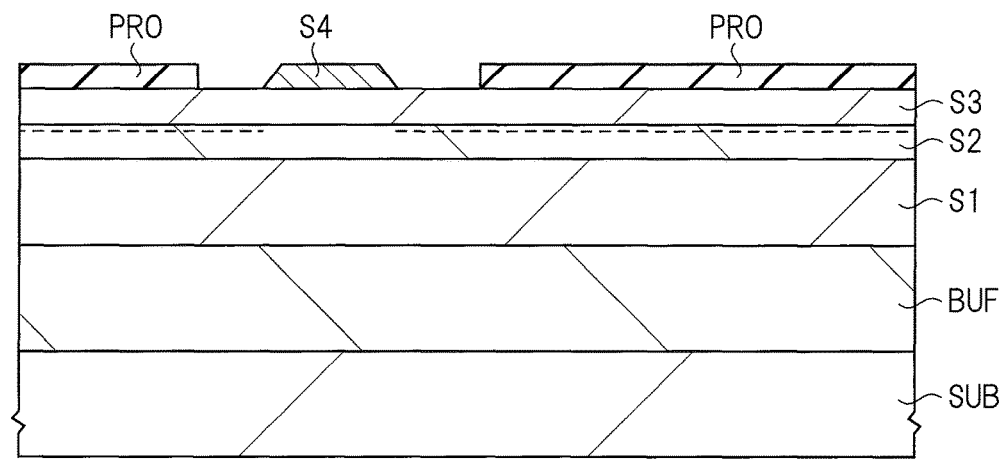
FIG. 19 is a cross-sectional view showing a manufacturing step of the semiconductor device of the second embodiment.

Next, as similar to the case of the first embodiment, a surface protective layer PRO is formed on the mesa type fourth nitride semiconductor layer (cap layer) S4 and the third nitride semiconductor layer (electron supply layer) S3. Next, the surface protective film PRO on the mesa type fourth nitride semiconductor layer (cap layer) S4 is removed (FIG. 19).

Figure 20:
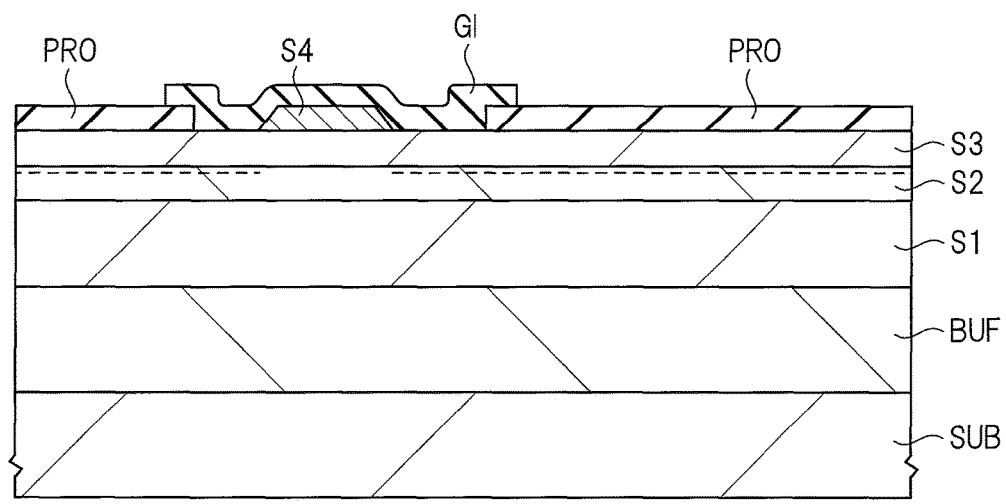
FIG. 20 is a cross-sectional view showing a manufacturing step of the semiconductor device of the second embodiment.

Next, as shown in FIG. 20, a gate insulating film GI is formed on the mesa type fourth nitride semiconductor layer (cap layer) S4. For example, an aluminum oxide film ($Al_2O_3$ film) is deposited as a gate insulating film GI on the surface protective film PRO including the upper portion of the mesa type fourth nitride semiconductor layer (cap layer) S4 and the exposed portions of the third nitride semiconductor layer (electron supply layer) S3 on the both sides thereof by using an ALD method or others.

Figure 21:
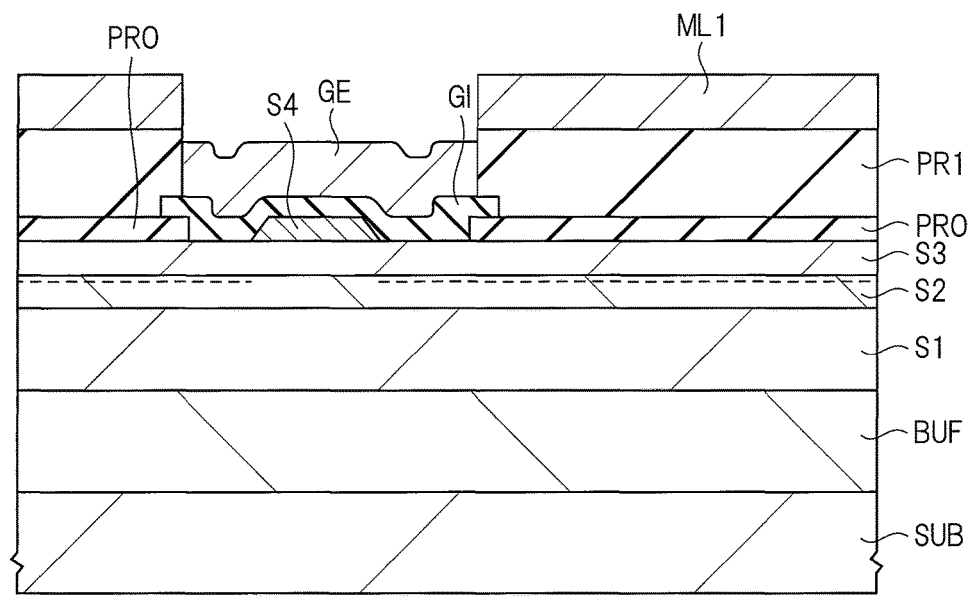
FIG. 21 is a cross-sectional view showing a manufacturing step of the semiconductor device of the second embodiment.
Figure 22:
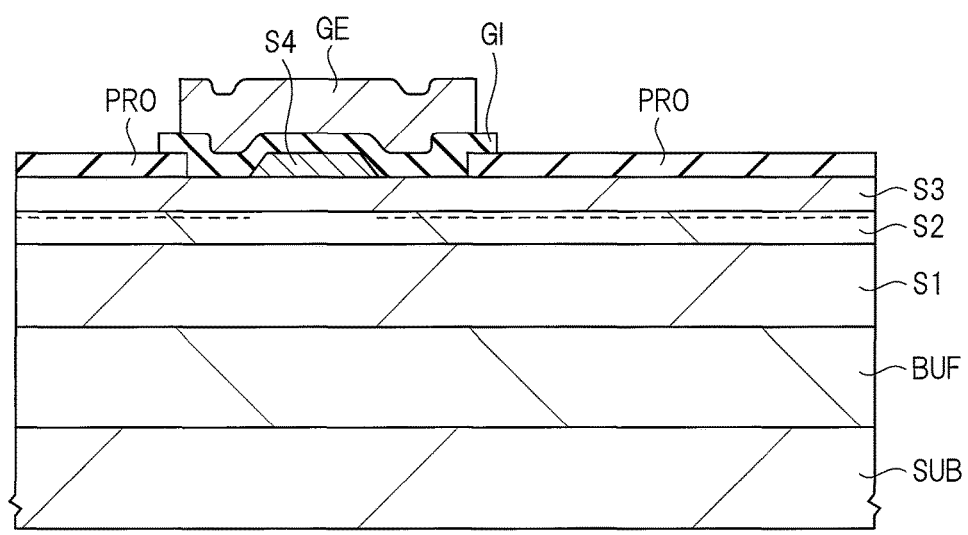
FIG. 22 is a cross-sectional view showing a manufacturing step of the semiconductor device of the second embodiment.

Next, as shown in FIG. 21 and FIG. 22, a gate electrode GE is formed on the gate insulating film GI. The gate electrode GE can be formed by using, for example, a lift-off method. For example, as shown in FIG. 21, a photoresist film PR1 is formed on the gate insulating film GI and the surface protective film PRO, and is exposed and developed (in the photolithography), so that the photoresist film PR1 on the formation region of the gate electrode GE is removed.

Next, a metal film ML1 is formed on the gate insulating film GI including the upper portion of the photoresist film PR1. Thus, in the formation region of the gate electrode GE, the metal film ML1 is directly formed on the gate insulating film GI. On the other hand, in the other regions, the metal film ML1 is formed on the photoresist film PR1. The metal film ML1 is constituted by, for example, a stacked film (Ni/Au film) of a nickel (Ni) film and a gold (Au) film formed on the nickel film. Each film forming the metal film ML1 can be formed by using, for example, a vacuum vapor deposition method.

Next, the photoresist film PR1 is removed. At this time, the metal film ML1 formed on the photoresist film PR1 is also removed together with the photoresist film PR1, so that the metal film ML1 (gate electrode GE) is left on only the gate insulating film GI (FIG. 22).

Figure 23:
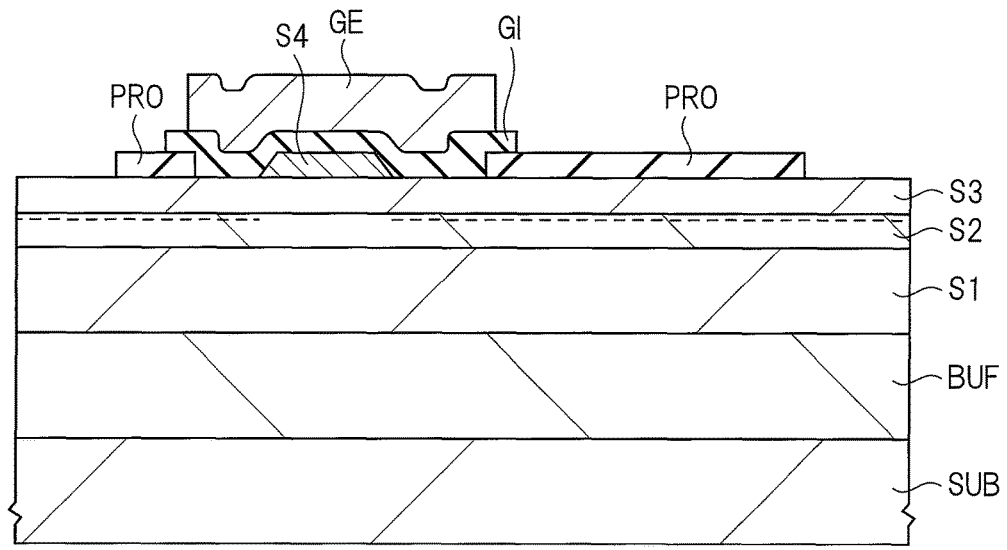
FIG. 23 is a cross-sectional view showing a manufacturing step of the semiconductor device of the second embodiment.

Next, as shown in FIG. 23, the surface protective film PRO in the formation regions of the source electrode SE and the drain electrode DE is removed by etching. Thus, the third nitride semiconductor layer (electron supply layer) S3 on both sides of the gate electrode GE is exposed.

Figure 24:
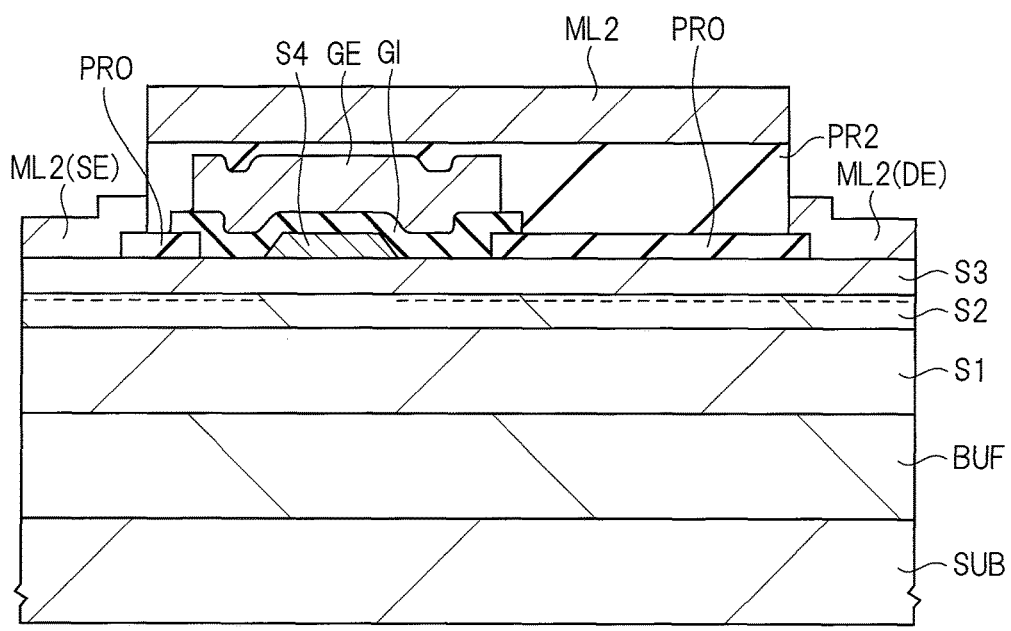
FIG. 24 is a cross-sectional view showing a manufacturing step of the semiconductor device of the second embodiment.
Figure 25:
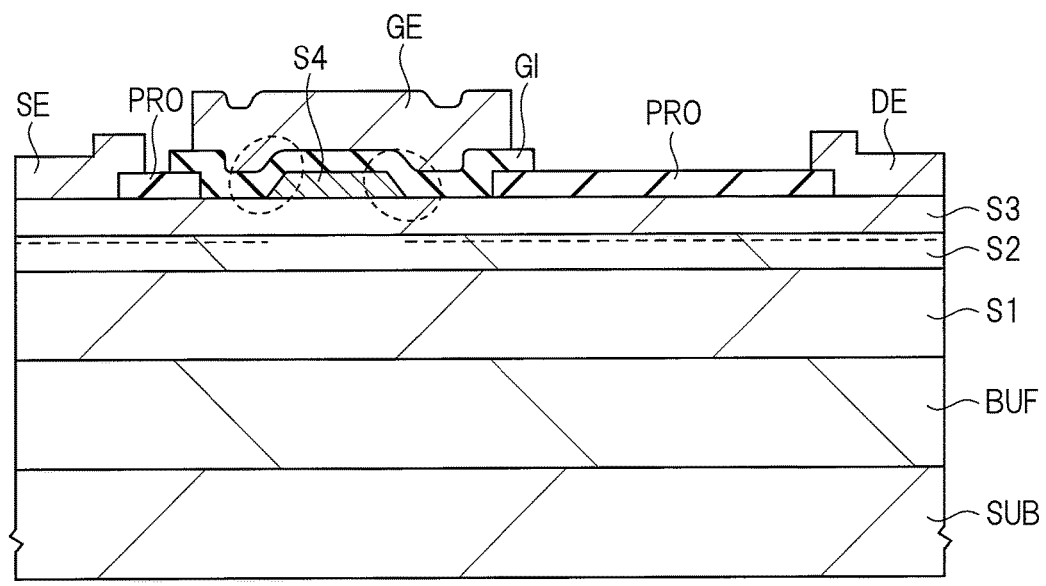
FIG. 25 is a cross-sectional view showing a manufacturing step of the semiconductor device of the second embodiment.

Next, as shown in FIG. 24 and FIG. 25, the source electrode SE and the drain electrode DE are formed. The source electrode SE and the drain electrode DE are formed by using, for example, a lift-off method. For example, as shown in FIG. 24, a photoresist film PR2 is formed on exposed portions of the gate electrode GE, the surface protective film PRO and the third nitride semiconductor (in the photolithography), so that the photoresist film PR2 on the exposed portions of the third nitride semiconductor layer (electron supply layer) S3 is removed.

Next, a metal film ML2 is formed on the exposed portions of the photoresist film PR2 and the third nitride semiconductor layer (electron supply layer) S3. Thus, the metal film ML2 is directly formed on the exposed portion of the third nitride semiconductor layer (electron supply layer) S3. On the other hand, in the other regions, the metal film ML2 is formed on the photoresist film PR2. The metal film ML2 is constituted by, for example, a stacked film (Ti/Al film) of a titanium (Ti) film and an aluminum (Al) film formed on the titanium film. Each film forming the metal film ML2 can be formed by using, for example, a vacuum vapor deposition method.

Next, the photoresist film PR2 is removed. At this time, the metal film ML2 formed on the photoresist film PR2 is also removed together with the photoresist film PR2, so that the metal film ML2 (source electrode SE, drain electrode DE) is left on only the exposed portion of the third nitride semiconductor layer (electron supply layer) S3 (FIG. 25). Next, a heating process (for example, at 500° C. for about 10 minutes) is performed. Thus, metal films forming the source electrode SE and the drain electrode DE can be electrically connected to the semiconductor in the lower layer.

By performing the above-described processes, the semiconductor device of the present embodiment can be formed. Moreover, the order of the gate forming process (FIG. 21 to FIG. 23), the source-drain electrode forming processes (FIG. 24 and FIG. 25) and the heating process may be replaced. Note that the above-described processes are described as one example, and the semiconductor device of the present embodiment may be manufactured by using processes other than the above-described processes.

Third Embodiment

In the present embodiment, a side surface of an end portion of a surface protective layer PRO, the end portion being closer to the mesa type fourth nitride semiconductor layer (cap layer) S4, is formed into a tapered shape.

[Explanation of Configuration]

Figure 26:
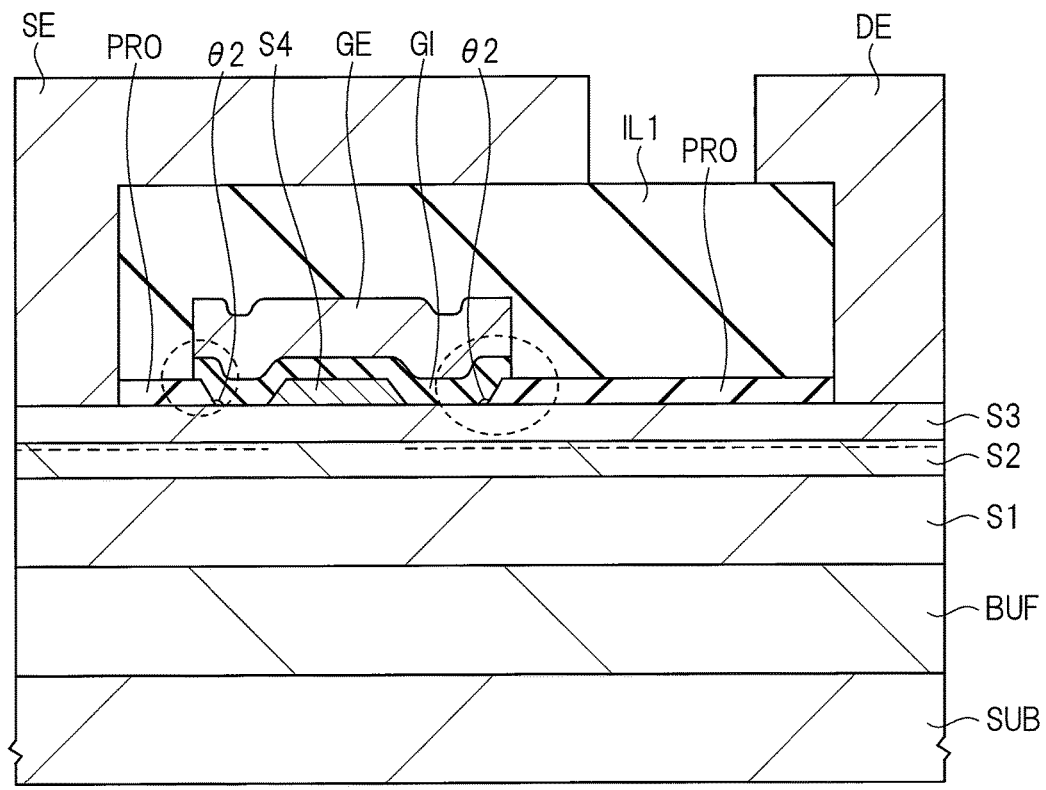
FIG. 26 is a cross-sectional view showing a configuration of a semiconductor device of a third embodiment.
Figure 27:
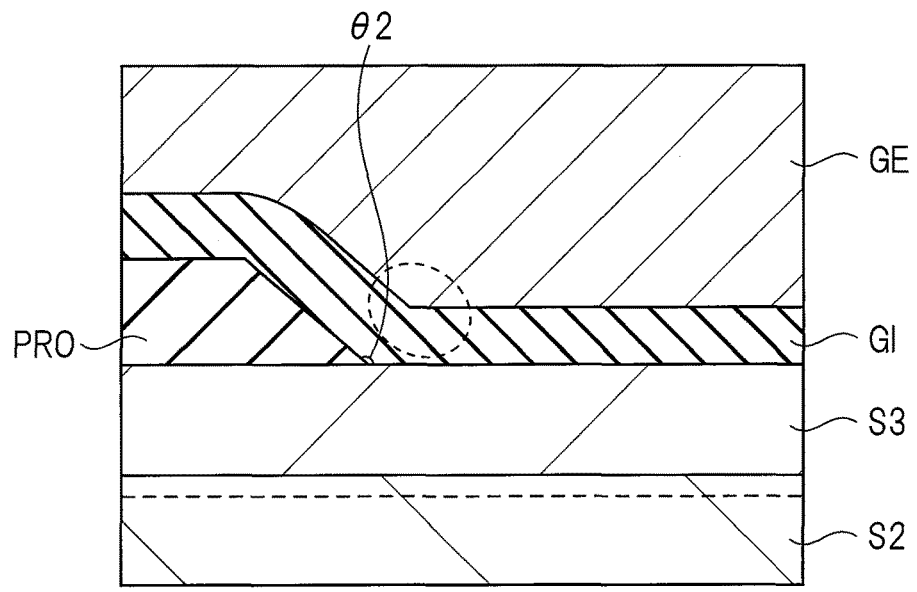
FIG. 27 is a cross-sectional view showing a configuration in vicinity of a gate insulating film of the semiconductor device of the third embodiment.
Figure 28:
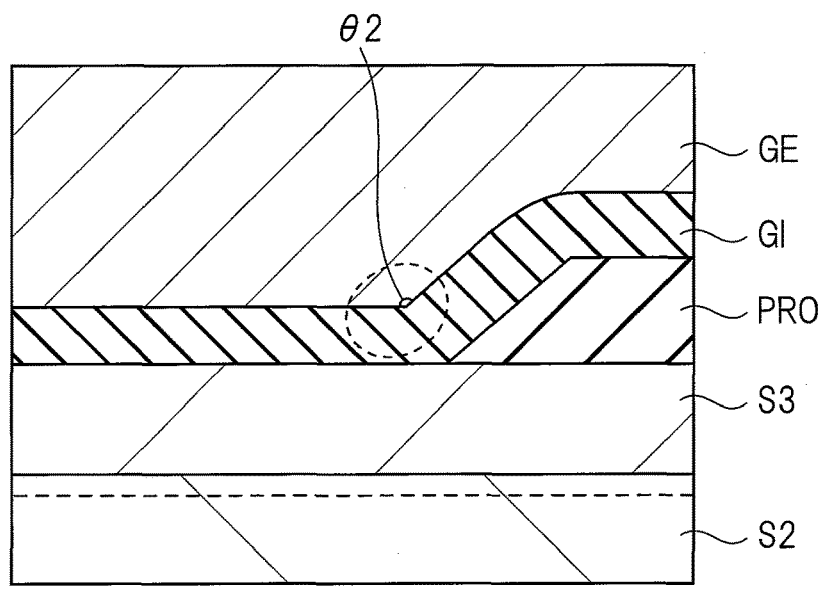
FIG. 28 is a cross-sectional view showing a configuration in vicinity of a gate insulating film of the semiconductor device of the third embodiment.

FIG. 26 is a cross-sectional view showing a configuration of a semiconductor device of the present embodiment. The configurations other than the side surface shape of the end portion of the surface protective film PRO, the end portion being closer to the mesa type fourth nitride semiconductor layer (cap layer) S4, are the same as those of the semiconductor device shown in the first embodiment (FIG. 1). FIG. 27 and FIG. 28 are cross-sectional views showing a configuration of the vicinity of the gate insulating film of the semiconductor device of the present embodiment. FIG. 27 is an enlarged view of vicinity of an end portion of a surface protective film PRO of the source electrode, and FIG. 28 is an enlarged view of vicinity of an end portion of a surface protective film PRO of the drain electrode.

In the present embodiment, a gate electrode GE is formed on the fourth nitride semiconductor layer (cap layer) S4 via a gate insulating film GI, and a surface protective film PRO is formed on the two sides of the fourth nitride semiconductor layer (cap layer) S4. Moreover, a source electrode SE and a drain electrode DE are formed in parts on both sides of the fourth nitride semiconductor layer (cap layer) S4, the parts being on the third nitride semiconductor layer (electron supply layer) S3. For example, the surface protective film PRO in the formation regions of the source electrode SE and the drain electrode DE is removed, so that the third nitride semiconductor layer (electron supply layer) S3 is exposed. On the exposed third nitride semiconductor layer (electron supply layer) S3, the source electrode SE and the drain electrode DE are formed.

Here, in the present embodiment, as shown by a round portion indicated by a broken line in FIG. 26 to FIG. 28, the side surface of the end portion of the surface protective film PRO, the end portion being closer to the mesa type fourth nitride semiconductor layer (cap layer) S4, is formed into a tapered shape. In other words, the end portion (side surface) of the surface protective film PRO to be disposed in the region where the gate insulating film GI and the surface protective film PRO overlap each other is formed into the tapered shape. For this reason, the electric field concentration at this portion (round portion indicated by the broken line) is moderated, so that the property degradation of the gate insulating film GI can be suppressed. An angle (taper angle, $\theta 2$) made by the surface of the third nitride semiconductor layer S3 and the side surface of the surface protective film PRO is set to be larger than 90 degrees, and more preferably 120 degrees or larger.

For example, in the semiconductor device (FIG. 26) of the present embodiment, when the potential of the source electrode SE is set to 0V, when the potential of the drain electrode DE is set to 0V and when the potential of the gate electrode GE is set to +20V which is the rated voltage, the potential of the two-dimensional electron gas (2DEG) becomes 0V which is the potential of the source electrode SE and the drain electrode DE. Therefore, right below the gate electrode GE, the voltage (20V) applied to the gate electrode GE is applied between the gate electrode GE and the two-dimensional electron gas (2DEG) in a vertical direction. At this time, in the present embodiment, since the side surface of the surface protective film PRO in the vicinity of the gate electrode GE has the tapered shape, the electric field concentration onto the gate insulating film GI is moderated, so that its property degradation can be suppressed.

Of course, also in the semiconductor device of the present embodiment, the gate insulating film GI is formed so as to cover the upper surface and side surfaces of the fourth nitride semiconductor layer (cap layer) S4, and each of the side surfaces of the fourth nitride semiconductor layer (cap layer) S4 is formed into the tapered shape, and therefore, the TDDB life can be further improved. As shown in the FIG. 56 described above, the case (E2) of the present embodiment has the steeper inclination of plots than those of the case (P) of the comparative example and the case (E1) of the first embodiment, and has the smaller variation in the dielectric breakdown distribution of the gate insulating film. In this manner, also from the data, the effect of further improving the TDDB life by the present embodiment has been confirmed. Moreover, the present embodiment also has the effect of suppressing the variation in the ON-resistance.

[Explanation of Manufacturing Method]

Next, with reference to FIG. 29 to FIG. 35, a method for manufacturing a semiconductor device of the present embodiment will be described, and the configuration of the semiconductor device will be more clearly described. FIG. 29 to FIG. 35 are cross-sectional views showing the manufacturing processes of the semiconductor device of the present embodiment.

For example, as similar to the case of the first embodiment, a nucleus generation layer (not shown), a high resistance buffer layer BUF, a first nitride semiconductor layer (buffer layer) S1, a second nitride semiconductor layer (channel layer) S2 and a third nitride semiconductor layer (electron supply layer) S3 are successively formed on a substrate SUB.

Figure 29:
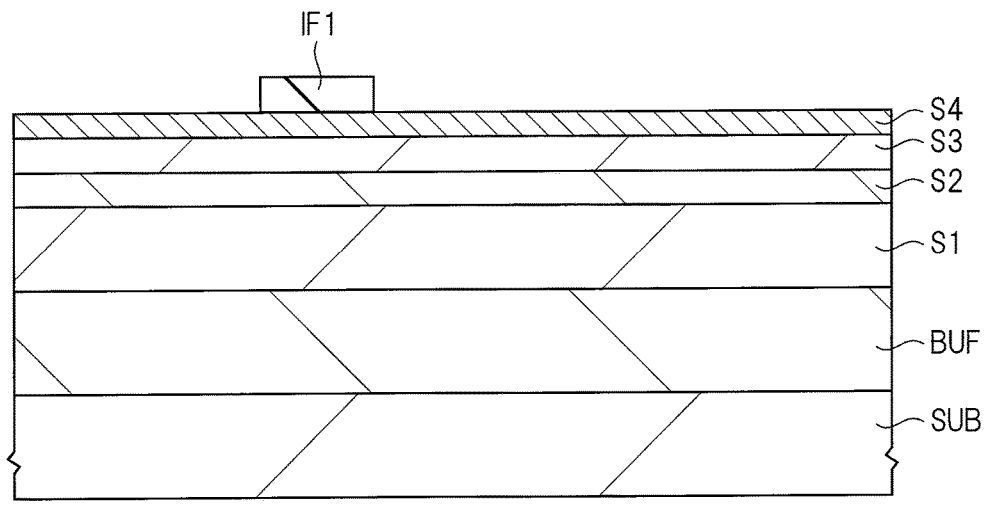
FIG. 29 is a cross-sectional view showing a manufacturing step of the semiconductor device of the third embodiment.
Figure 30:
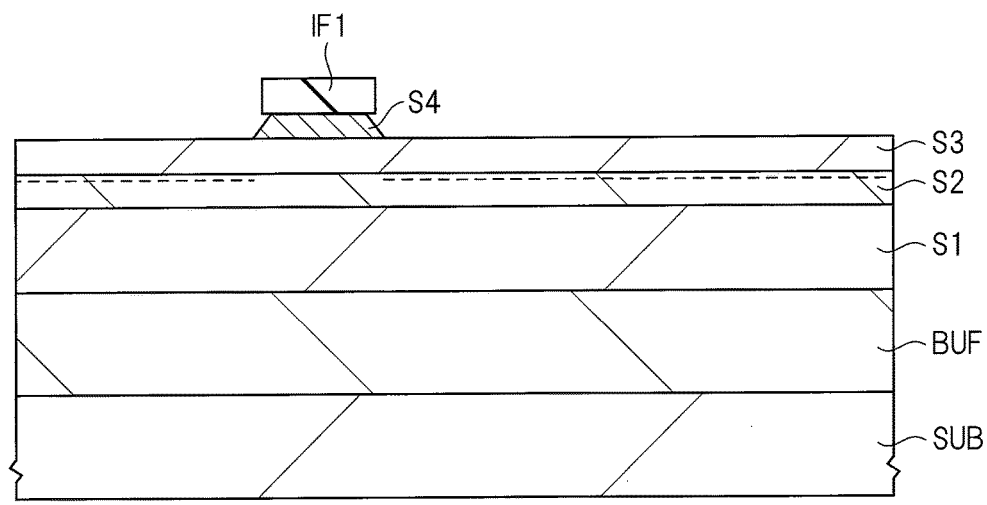
FIG. 30 is a cross-sectional view showing a manufacturing step of the semiconductor device of the third embodiment.
Figure 31:
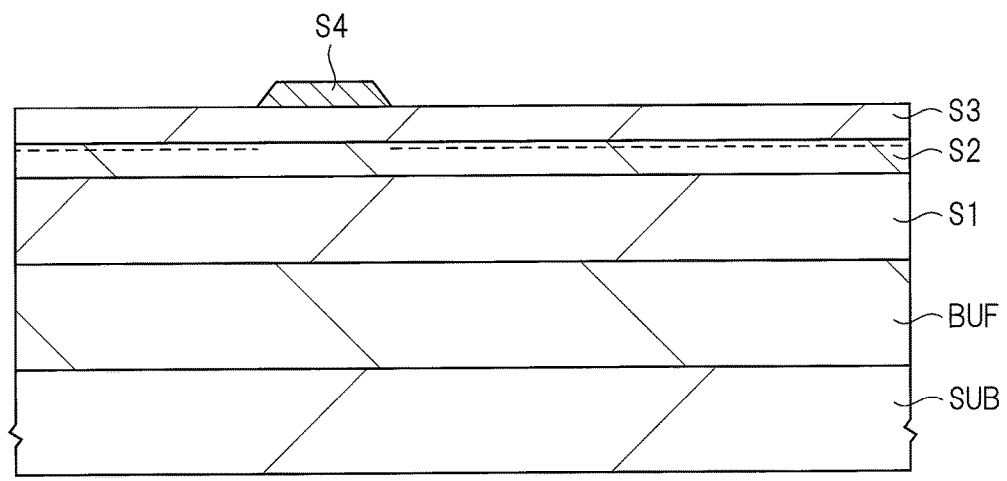
FIG. 31 is a cross-sectional view showing a manufacturing step of the semiconductor device of the third embodiment.

Next, as similar to the case of the first embodiment, after the fourth nitride semiconductor layer (cap layer) S4 is formed on the third nitride semiconductor layer S3, the fourth nitride semiconductor layer (cap layer) S4 is processed into a mesa type by using photolithography and etching techniques or others. For example, as similar to the first embodiment, the insulating film IF1 is left in only the formation region of the mesa type fourth nitride semiconductor layer (cap layer) S4 (FIG. 29). Next, after the fourth nitride semiconductor layer (cap layer) S4 is etched by using the insulating film IF1 as a mask, a heating process is performed (FIG. 30). Next, the insulating film IF1 is removed (FIG. 31). In this manner, the fourth nitride semiconductor layer (cap layer) S4 having the side surface formed into a tapered shape as explained in the first embodiment in detail can be formed.

Figure 32:
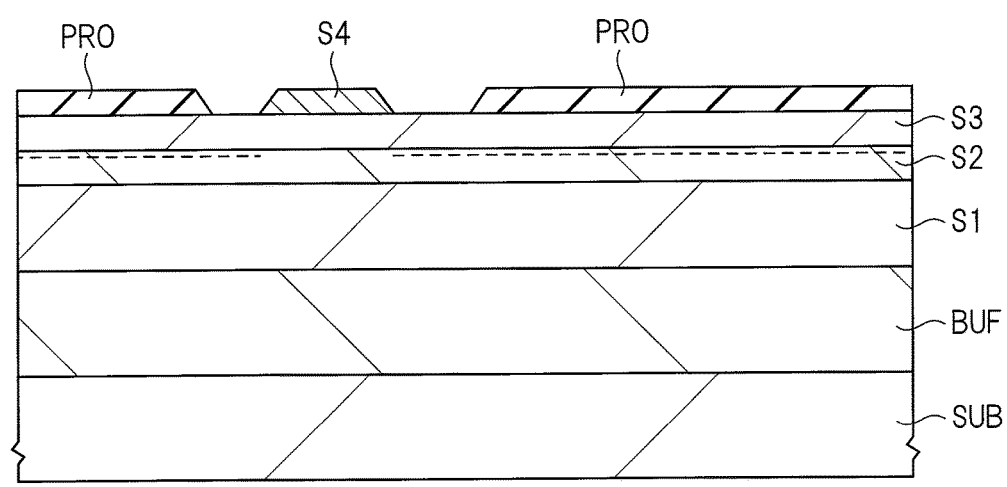
FIG. 32 is a cross-sectional view showing a manufacturing step of the semiconductor device of the third embodiment.

Next, as shown in FIG. 32, a surface protective layer PRO is formed on the mesa type fourth nitride semiconductor layer (cap layer) S4 and the third nitride semiconductor layer (electron supply layer) S3, and the surface protective film PRO on the mesa type fourth nitride semiconductor layer (cap layer) S4 is removed.

For example, as the surface protective film PRO, a silicon nitride film is deposited with a thickness of about 100 nm by using a plasma CVD method or others. As the surface protective film PRO, not only the silicon nitride film (SiN film) but also a silicon oxide film ($SiO_2$ film), silicon oxynitride film (SiON film), an aluminum oxide film ($Al_2O_3$) or others may be used. Although the method for forming these insulating films is not particularly limited, the above-described silicon oxide film can be formed by using, for example, a thermal CVD method. Moreover, the above-described aluminum oxide film can be formed by using, for example, an ALD method.

Next, by using a photoresist film (not shown) having an opening located on the upper portion of the mesa type fourth nitride semiconductor layer (cap layer) S4 as a mask, the surface protective film PRO is etched, the surface protective film PRO being located on the upper portion of the mesa type fourth nitride semiconductor layer (cap layer) S4 and on partial regions of the third nitride semiconductor layer (electron supply layer) S3 on both sides of the mesa type fourth nitride semiconductor layer (cap layer) S4. For example, the surface protective film PRO is etched by dry etching using a fluorine-based gas. At the time of this dry etching, isotropic components are made larger. For example, there are methods of decreasing a substrate bias and increasing a discharging pressure or others. In this manner, by using the isotropic dry etching, the side surface of the surface protective film PRO can be formed into a tapered shape. In place of the isotropic dry etching, wet etching may be performed. For example, the surface protective film PRO is etched by wet etching using hydrofluoric acid (HF), buffered hydrofluoric acid (BHF) or others. The buffered hydrofluoric acid is a chemical solution containing hydrofluoric acid and ammonium fluoride. Next, the photoresist film is removed.

By the above-described etching process, the angle (taper angle, θ2) made by the surface of the third nitride semiconductor layer S3 and the side surface of the surface protective film PRO is set to be larger than 90 degrees, more preferably 120 degrees or larger.

Figure 33:
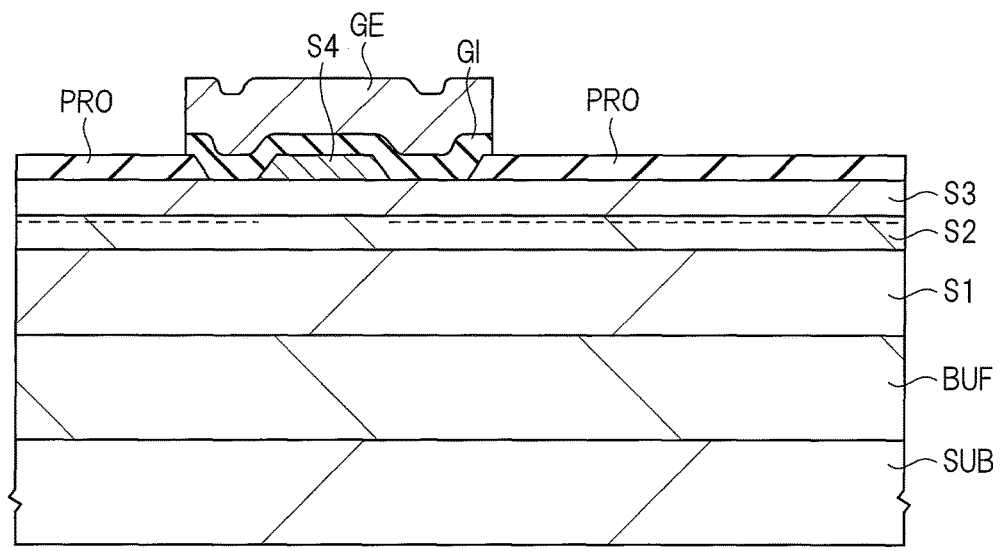
FIG. 33 is a cross-sectional view showing a manufacturing step of the semiconductor device of the third embodiment.
Figure 34:
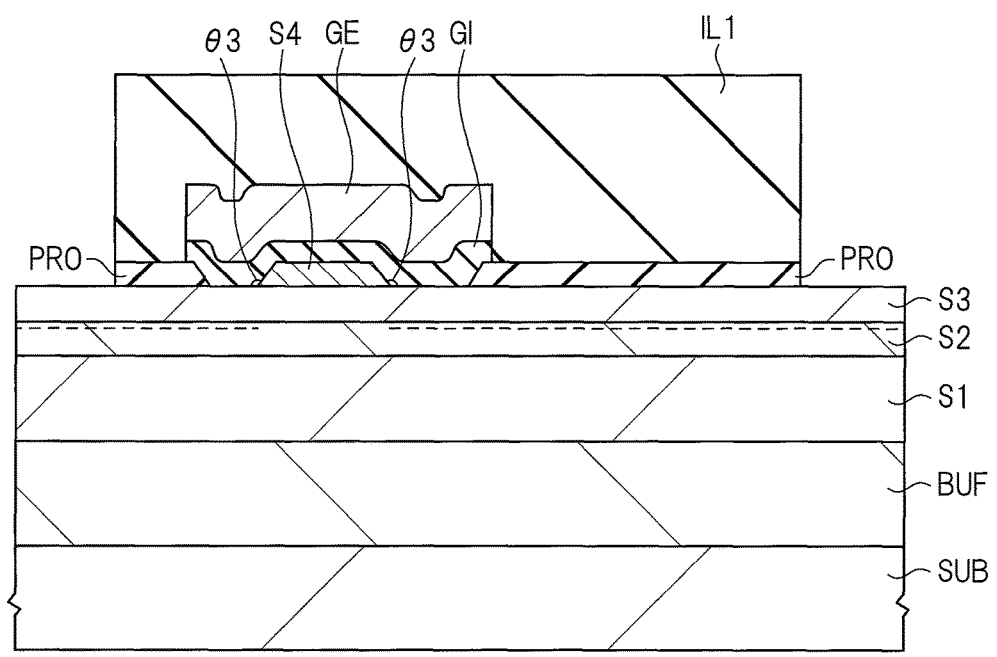
FIG. 34 is a cross-sectional view showing a manufacturing step of the semiconductor device of the third embodiment.
Figure 35:
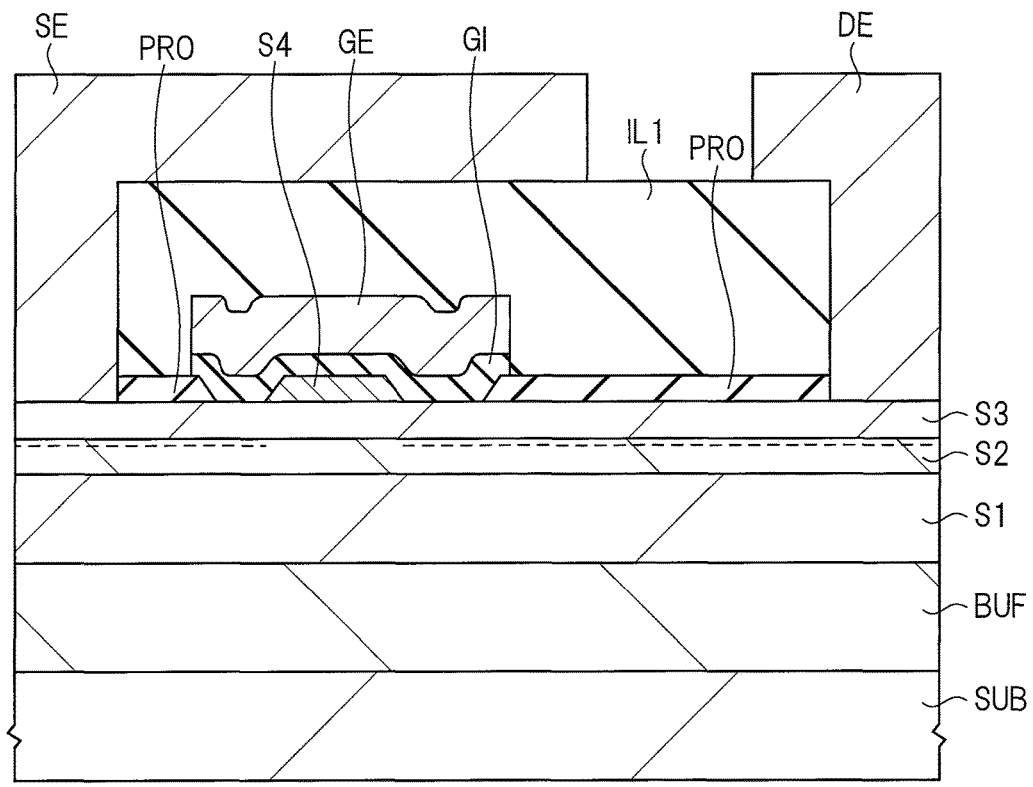
FIG. 35 is a cross-sectional view showing a manufacturing step of the semiconductor device of the third embodiment.

Next, as similar to the case of the first embodiment, a gate electrode GE is formed on the mesa type fourth nitride semiconductor layer (cap layer) S4 via the gate insulating film GI (FIG. 33). Next, an interlayer insulating film IL1 is formed on the gate electrode GE and the surface protective film PRO, and a contact hole is formed by etching the interlayer insulating film IL1 and the surface protective film PRO in the source electrode connection region and the drain electrode connection region (FIG. 34). Next, a source electrode SE and a drain electrode DE are formed on the interlayer insulating film IL1 including the inside of the contact hole (FIG. 35).

By performing the above-described processes, the semiconductor device of the present embodiment can be formed. Note that the above-described processes are described as one example. By using processes other than the above-described processes, the semiconductor device of the present embodiment may be manufactured.

Fourth Embodiment

In the above-described embodiment 3, the gate electrode GE, the source electrode SE and the drain electrode DE are formed by using so-called photolithography and etching techniques. However, these electrodes may be formed by using a so-called lift-off method.

[Explanation of Configuration]

Figure 36:
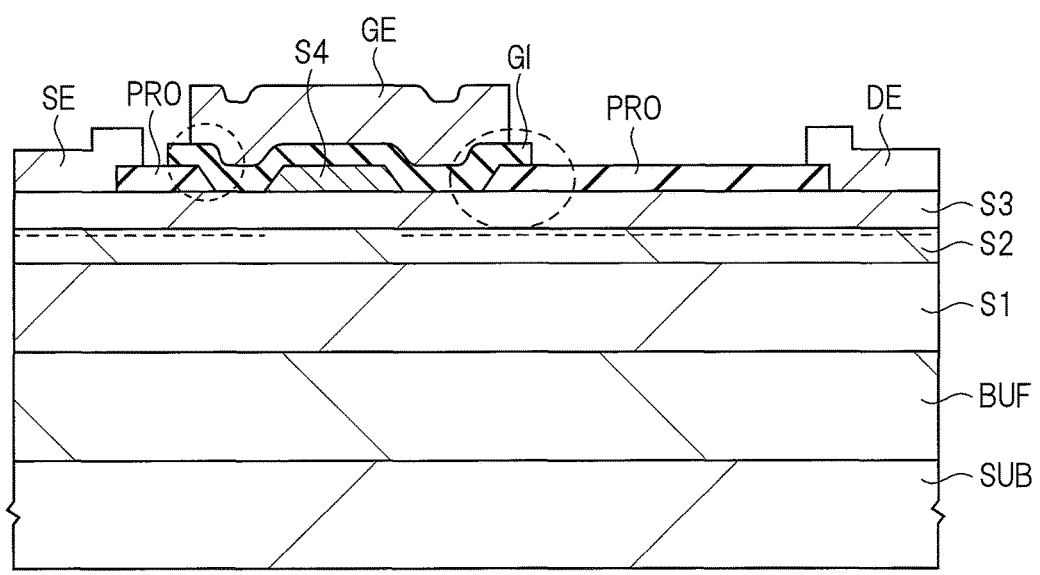
FIG. 36 is a cross-sectional view showing a configuration of a semiconductor device of a fourth embodiment.

FIG. 36 is a cross-sectional view showing a configuration of a semiconductor device of the present embodiment. The configurations other than the source electrode SE and drain electrode DE are the same as those of the semiconductor device shown in the third embodiment (FIG. 26).

In the present embodiment, a gate electrode GE is formed on the fourth nitride semiconductor layer (cap layer) S4 via a gate insulating film GI, and a surface protective film PRO is formed on the two sides of the fourth nitride semiconductor layer (cap layer) S4. Moreover, a source electrode SE and a drain electrode DE are formed in parts on both sides of the fourth nitride semiconductor layer (cap layer) S4, the parts being on the third nitride semiconductor layer (electron supply layer) S3. For example, the surface protective film PRO in the formation regions of the source electrode SE and the drain electrode DE is removed, so that the third nitride semiconductor layer (electron supply layer) S3 is exposed. On the exposed third nitride semiconductor layer (electron supply layer) S3, the source electrode SE and the drain electrode DE are formed.

As described above, also in the semiconductor device of the present embodiment, the gate insulating film GI is formed so as to cover the upper surface and side surface of the fourth nitride semiconductor layer (cap layer) S4, and the side surface of the fourth nitride semiconductor layer (cap layer) S4 is formed into a tapered shape, and therefore, the TDDB life can be effectively improved as explained in the first embodiment in detail. Moreover, the variation in the ON resistance can be effectively suppressed.

Moreover, the side surface of the end portion of the surface protective film PRO, the end portion being closer to the mesa type fourth nitride semiconductor layer (cap layer) S4, is formed into a tapered shape, and therefore, the electric field concentration is moderated at the side surface, so that the property degradation of the gate insulating film GI can be suppressed, as explained in the third embodiment in detail.

[Explanation of Manufacturing Method]

Figure 37:
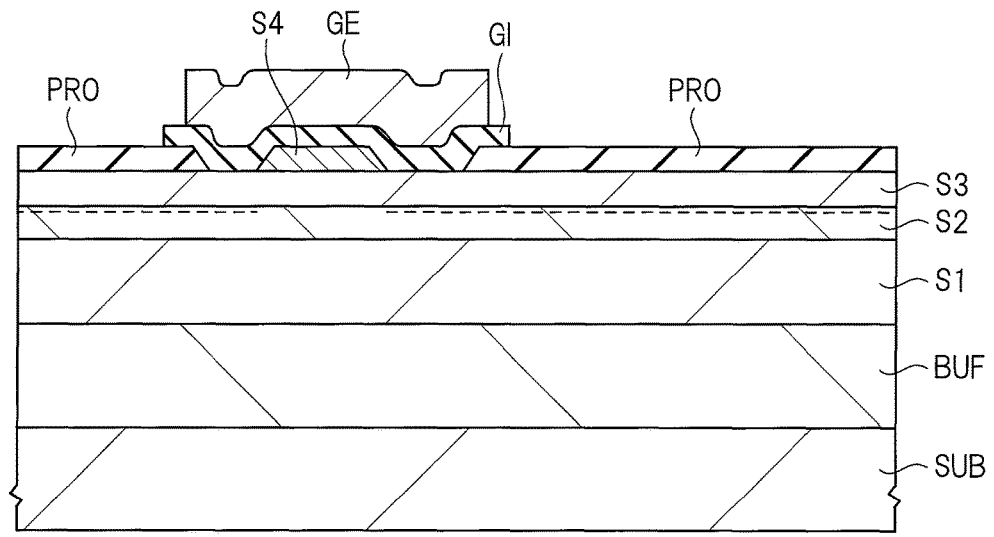
FIG. 37 is a cross-sectional view showing a manufacturing step of the semiconductor device of the fourth embodiment.
Figure 38:
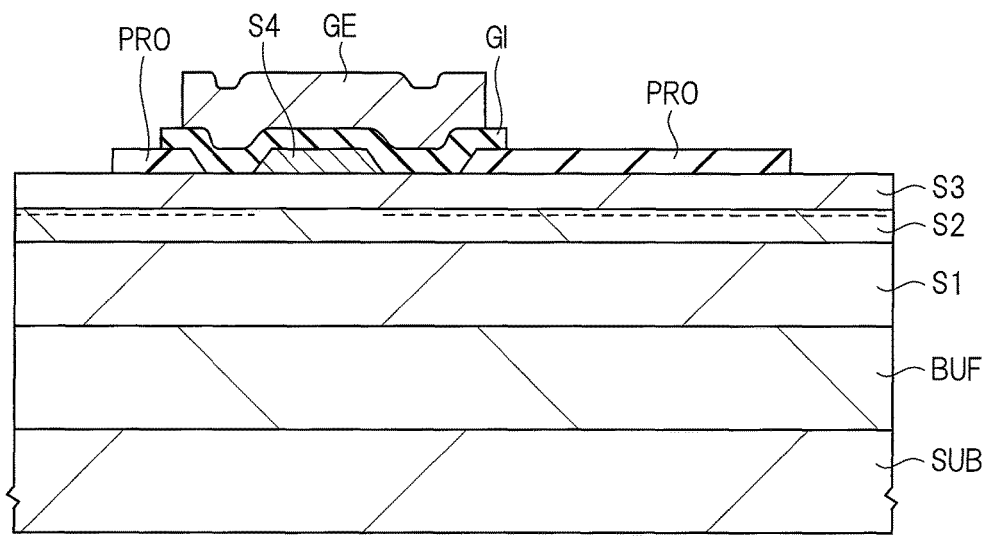
FIG. 38 is a cross-sectional view showing a manufacturing step of the semiconductor device of the fourth embodiment.
Figure 39:
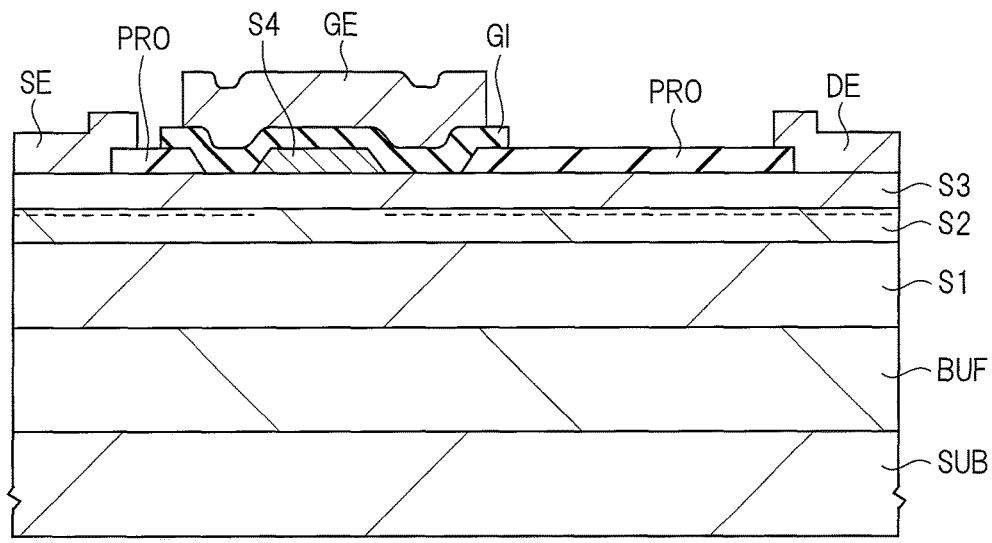
FIG. 39 is a cross-sectional view showing a manufacturing step of the semiconductor device of the fourth embodiment.

Next, with reference to FIG. 37 to FIG. 39, a method for manufacturing a semiconductor device of the present embodiment will be described, and the configuration of the semiconductor device will be more clearly described. FIG. 37 to FIG. 39 are cross-sectional views showing the manufacturing processes of the semiconductor device of the present embodiment.

For example, as similar to the case of the first embodiment, a nucleus generation layer (not shown), a high resistance buffer layer BUF, a first nitride semiconductor layer (buffer layer) S1, a second nitride semiconductor layer (channel layer) S2 and a third nitride semiconductor layer (electron supply layer) S3 are successively formed on a substrate SUB.

Next, as similar to the case of the first embodiment, after the fourth nitride semiconductor layer (cap layer) S4 is formed on the third nitride semiconductor layer S3, the fourth nitride semiconductor layer (cap layer) S4 is processed into a mesa type by using photolithography and etching techniques or others. For example, as similar to the first embodiment, after the fourth nitride semiconductor layer (cap layer) S4 is etched by using the insulating film IF1 as a mask, a heating process is performed. In this manner, the fourth nitride semiconductor layer (cap layer) S4 having the side surface formed into a tapered shape as explained in the first embodiment in detail can be formed.

Next, as similar to the case of the first embodiment, a surface protective layer PRO is formed on the mesa type fourth nitride semiconductor layer (cap layer) S4 and the third nitride semiconductor layer (electron supply layer) S3, and the surface protective film PRO on the mesa type fourth nitride semiconductor layer (cap layer) S4 is etched. By this etching process, the side surface of the surface protective film PRO can be formed into a tapered shape as explained in the third embodiment in detail.

Next, as shown in FIG. 37, an aluminum oxide film is formed on the mesa type fourth nitride semiconductor layer (cap layer) S4 as a gate insulating film GI by using an ALD method or others. Further, on the gate insulating film GI, a gate electrode GE is formed by using a lift-off method as similar to the case of the third embodiment. Next, as shown in FIG. 38, the surface protective film PRO in the formation regions of the source electrode SE and drain electrode DE is removed by etching. Thus, the third nitride semiconductor layers (electron supply layer) S3 on both sides of the gate electrode GE are exposed. Next, as shown in FIG. 39, the source electrode SE and the drain electrode DE are formed by using the lift-off method as similar to the third embodiment.

By performing the above-described processes, the semiconductor device of the present embodiment can be formed. Note that the above-described processes are described as one example. By using processes other than the above-described processes, the semiconductor device of the present embodiment may be manufactured.

Fifth Embodiment

In the present embodiment, the film thickness of the gate insulating film GI is made thicker.

[Explanation of Configuration]

Figure 40:
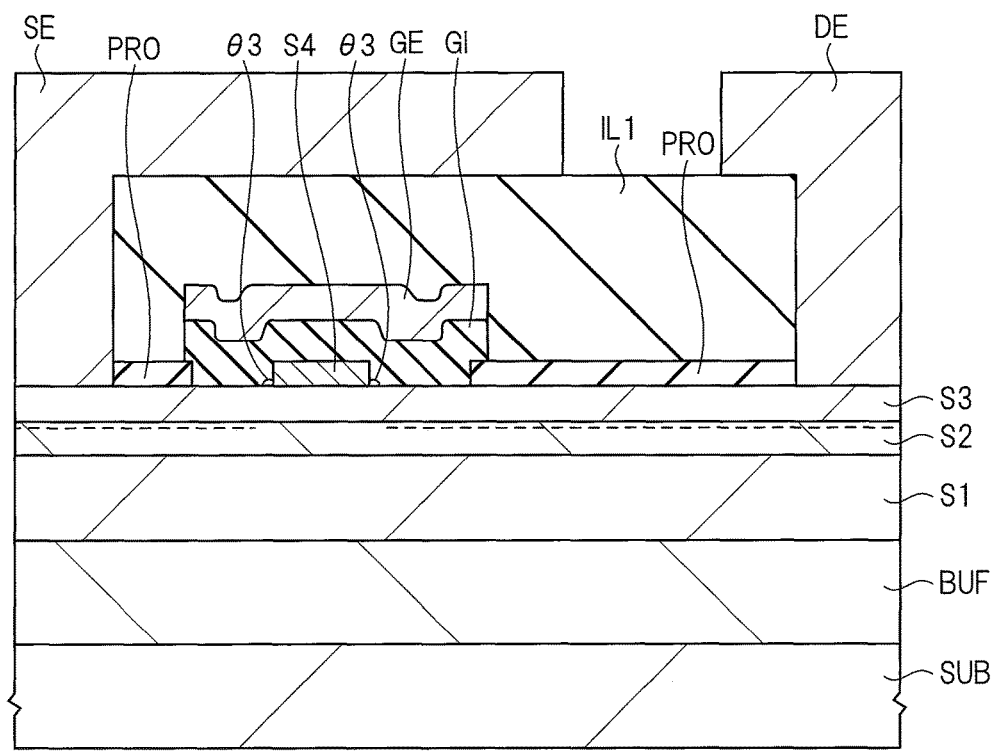
FIG. 40 is a cross-sectional view showing a configuration of a semiconductor device of a fifth embodiment.
Figure 41:
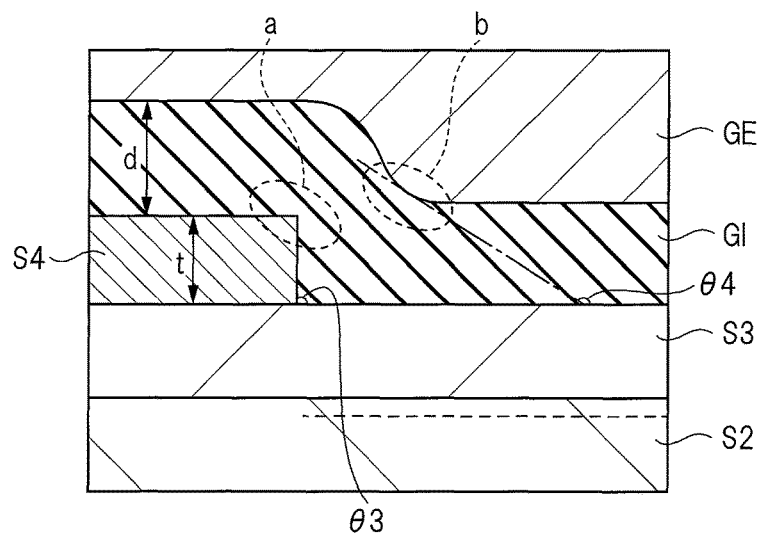
FIG. 41 is a cross-sectional view showing a configuration in vicinity of a gate insulating film of the semiconductor device of the fifth embodiment.

FIG. 40 is a cross-sectional view showing a configuration of a semiconductor device of the present embodiment. The configurations other than the shape of the fourth nitride semiconductor layer (cap layer) S4 and the film thickness of the gate insulating film GI are the same as those of the semiconductor device shown in the first embodiment (FIG. 1). FIG. 41 is a cross-sectional view showing a configuration in the vicinity of the gate insulating film of the semiconductor device of the present embodiment.

As shown in FIG. 40, in the present embodiment, the cross-sectional shape of the fourth nitride semiconductor layer (cap layer) S4 is not a trapezoidal shape as shown in the first embodiment (FIG. 1), but a substantially rectangular shape. Thus, the angle (taper angle, θ3) made by the surface of the third nitride semiconductor layer S3 and the side surface of the fourth nitride semiconductor layer S4 is about 90 degrees.

In this manner, by forming the side surface of the fourth nitride semiconductor layer S4 not to a tapered shape so as to increase the film thickness of the gate insulating film GI (d>t), the electric field concentration onto the gate insulating film GI may be moderated (FIG. 41). The film thickness (d) of the gate insulating film GI is preferably equal to or larger than 1.5 times the film thickness (t) of the fourth nitride semiconductor layer S4 (d≥1.5t), and more preferably equal to or larger than 2 times the film thickness (d≥2t). The film thickness (d) of the gate insulating film GI means the film thickness on the fourth nitride semiconductor layer S4.

In this manner, by increasing the film thickness of the gate insulating film GI, an angle of the step difference (portion "b") of the gate insulating film GI opposing to the corner portion (side surface upper portion, portion "a") of the fourth nitride semiconductor layer S4 can be suppressed from being an acute angle. For example, an angle (taper angle, θ4) made by the side surface (a tangent line if being rounded) of the above-described step difference portions (both of them closer to the source electrode and the drain electrode) and the surface of the third nitride semiconductor layer S3 becomes larger than 90 degrees. For this reason, the electric field concentration onto the gate insulating film GI is moderated, so that the property degradation of the gate insulating film GI can be suppressed.

[Explanation of Manufacturing Method]

The semiconductor device of the present embodiment can be formed by using the same processes as those of the first embodiment. However, when the fourth nitride semiconductor layer S4 is processed by using the insulating film (IF1) as a mask, the fourth nitride semiconductor layer S4 may be subjected to an anisotropic dry etching process so that the side surface of the fourth nitride semiconductor layer S4 is formed into a substantially vertical shape. Moreover, when the gate insulating film GI is formed after processing the fourth nitride semiconductor layer S4, its film thickness is adjusted so as to be equal to or larger than 1.5 times the thickness (t) of the fourth nitride semiconductor layer S4, and more preferably equal to or larger than 2 times the thickness.

Sixth Embodiment

In the first embodiment (FIG. 1), the side surface of the fourth nitride semiconductor layer S4 is formed into a tapered shape. However, the side surface of the fourth nitride semiconductor layer S4 may be formed into a step shape. That is, it is only required to gradually (step by step) reduce the film thickness of the fourth nitride semiconductor layer S4 at both end portions, and its shape may be either a tapered shape or a step shape. In other words, it is only required to reduce the film thickness of the fourth nitride semiconductor layer S4 gradually toward its end portions.

[Explanation of Configuration]

Figure 42:
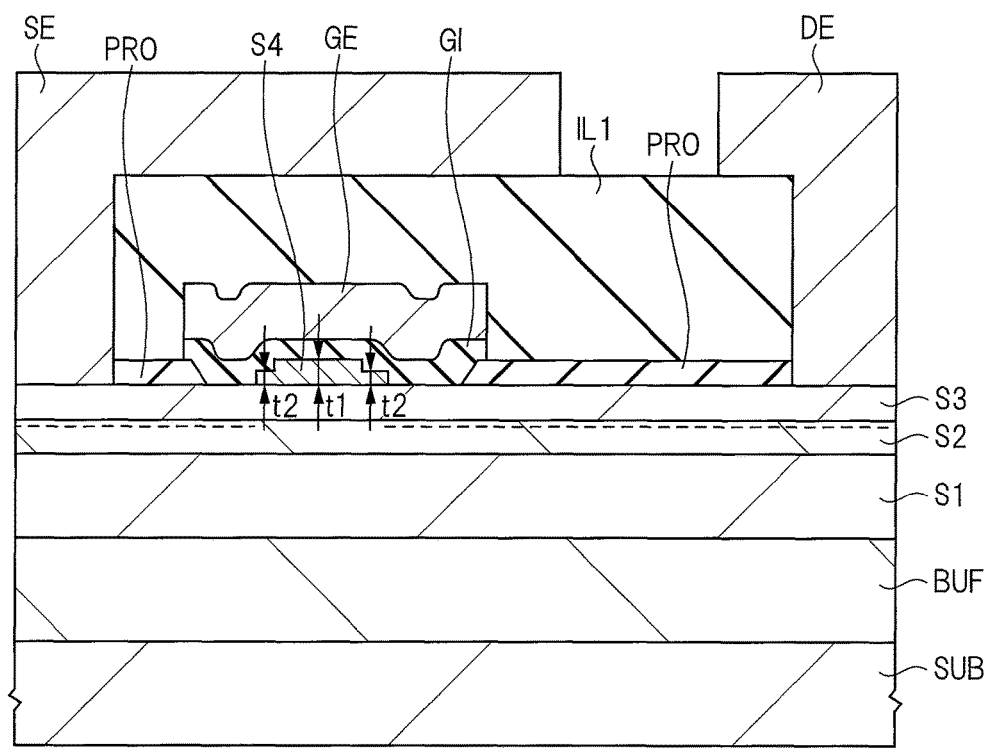
FIG. 42 is a cross-sectional view showing a configuration of a semiconductor device of a sixth embodiment.
Figure 43:
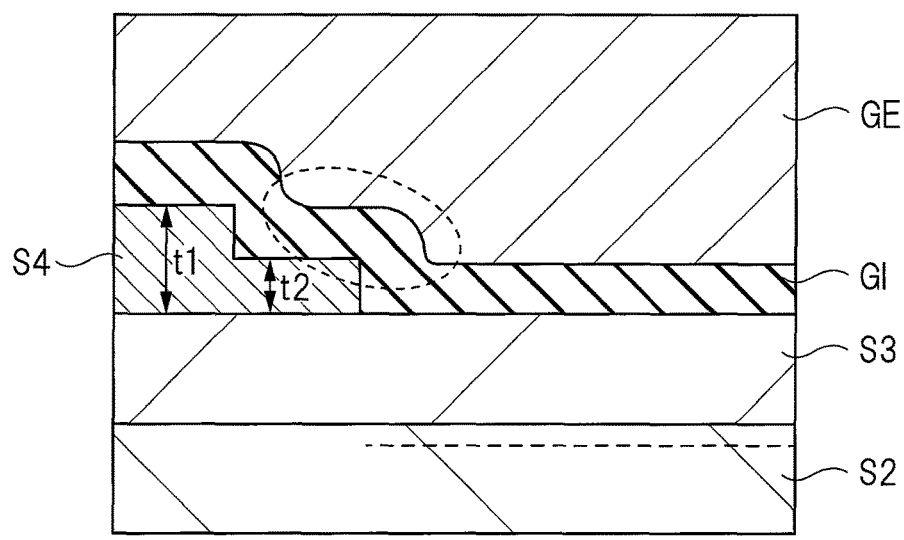
FIG. 43 is a cross-sectional view showing a configuration in vicinity of a gate insulating film of the semiconductor device of the sixth embodiment.
Figure 44:
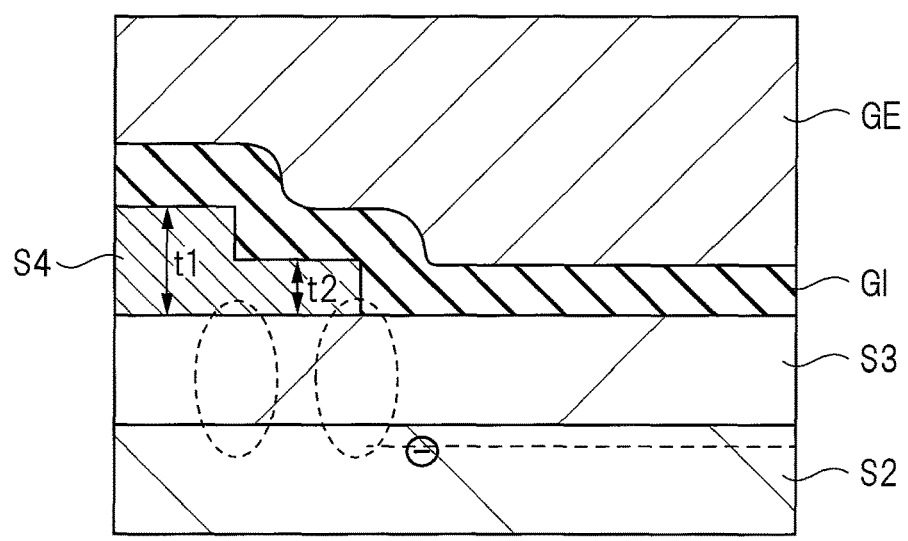
FIG. 44 is a cross-sectional view showing a configuration in vicinity of a gate insulating film of the semiconductor device of the sixth embodiment.

FIG. 42 is a cross-sectional view showing a configuration of a semiconductor device of the present embodiment. The configurations other than the shape of each of the both end portions of the fourth nitride semiconductor layer (cap layer) S4 are the same as those of the semiconductor device shown in the first embodiment (FIG. 1). Each of FIG. 43 and FIG. 44 is the cross-sectional view showing the configuration in the vicinity of the gate insulating film of the semiconductor device of the present embodiment. FIG. 43 is an enlarged view of vicinity of an end portion of the fourth nitride semiconductor layer (cap layer) S4, the end portion being closer to the drain electrode, and FIG. 44 is another enlarged view of vicinity of an end portion of the fourth nitride semiconductor layer (cap layer) S4, the end portion being closer to the drain electrode.

As shown in FIG. 42 to FIG. 44, in the semiconductor device of the present embodiment, the end portion of the fourth nitride semiconductor layer (cap layer) S4 has a first film thickness portion (thick film portion) and a second film thickness portion (thin film portion). The second film thickness portion (thin film portion) is outside the first film thickness portion (thick film portion). The film thickness (t1) of the first film thickness portion is larger than the film thickness (t2) of the second film thickness portion (t1>t2). For example, the film thickness (t2) of the second film thickness portion is set to about ½ of the film thickness (t1) of the first film thickness portion. More specifically, t1 can be set to about 100 nm, and t2 can be set to about 50 nm.

In this manner, also in the semiconductor device of the present embodiment, the gate insulating film GI is formed so as to cover the fourth nitride semiconductor layer (cap layer) S4, and each of the end portions (side surfaces) of the fourth nitride semiconductor layer (cap layer) S4 is formed to have a two- or more-level step shape, and therefore, the TDDB life can be effectively improved. Moreover, the variation in the ON resistance can be effectively suppressed.

For example, in the semiconductor device of the present embodiment, when the potential of the source electrode SE is set to 0V, when the potential of the drain electrode DE is set to 0V, and when the potential of the gate electrode GE is set to +20V which is the rated voltage, the potential of the two-dimensional electron gas 2DEG becomes 0V which is the potentials of the source electrode SE and the drain electrode DE. Therefore, between the gate electrode GE and the two-dimensional electron gas 2DEG in a portion right below the gate electrode GE, a voltage (20V) to be applied to the gate electrode GE is added in a vertical direction. At this time, in the present embodiment, the corner having the steps with the small level difference is dispersedly disposed at two locations in the end portions of the fourth nitride semiconductor layer (cap layer) S4, and therefore, an electric field concentration onto the gate insulating film GI formed along the end portion of the fourth nitride semiconductor layer (cap layer) S4 is moderated (at a circular portion indicated by a broken line in FIG. 43).

Moreover, for example, in the semiconductor device of the present embodiment, in a case of setting the potential of the gate electrode GE to 0V so as to provide an OFF state, consideration is given to a case of making a potential difference of 400V between the potential of the source electrode SE and the potential of the drain electrode DE, that is, a case of applying such a high voltage. In such a case, in the present embodiment, the end portion of the fourth nitride semiconductor layer (cap layer) S4 has the two- or more-level step shape, and therefore, the electric field concentration portion in the third nitride semiconductor layer (electron supply layer) S3 closer to the drain electrode DE is dispersed into two locations, so that the electric field intensity of each of the locations is moderated. Therefore, the injection of electrons into the third nitride semiconductor layer (electron supply layer) S3 and the second nitride semiconductor layer (channel layer) S2 is suppressed. Consequently, the current blocking caused by the injection of electrons is suppressed, and therefore, the voltage of the gate electrode GE is changed from 0V to 10V. Therefore, when the transistor is turned from the OFF state to the ON state, degradation in the ON resistance of the transistor can be suppressed.

[Explanation of Manufacturing Method]

Next, with reference to FIG. 45 to FIG. 50, a method for manufacturing a semiconductor device of the present embodiment will be described, and the configuration of the semiconductor device will be more clearly described. FIG. 45 to FIG. 50 are cross-sectional views showing the manufacturing processes of the semiconductor device of the present embodiment.

For example, as similar to the case of the first embodiment, a nucleus generation layer (not shown), a high resistance buffer layer BUF, a first nitride semiconductor layer (buffer layer) S1, a second nitride semiconductor layer (channel layer) S2 and a third nitride semiconductor layer (electron supply layer) S3 are successively formed on a substrate SUB.

Next, on the third nitride semiconductor layer S3, a GaN layer is epitaxially grown with a thickness of about 100 nm as the fourth nitride semiconductor layer (cap layer) S4 by using a metal organic chemical vapor deposition method or others.

Figure 45:
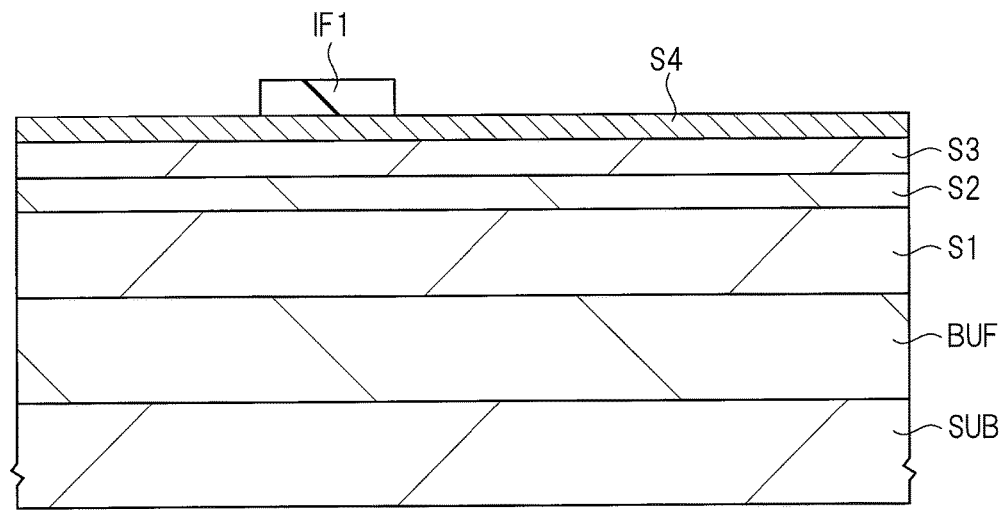
FIG. 45 is a cross-sectional view showing a manufacturing step of the semiconductor device of the sixth embodiment.

Next, on the fourth nitride semiconductor layer (cap layer) S4, an insulating film IF1 to be a mask is formed (FIG. 45).

Figure 46:
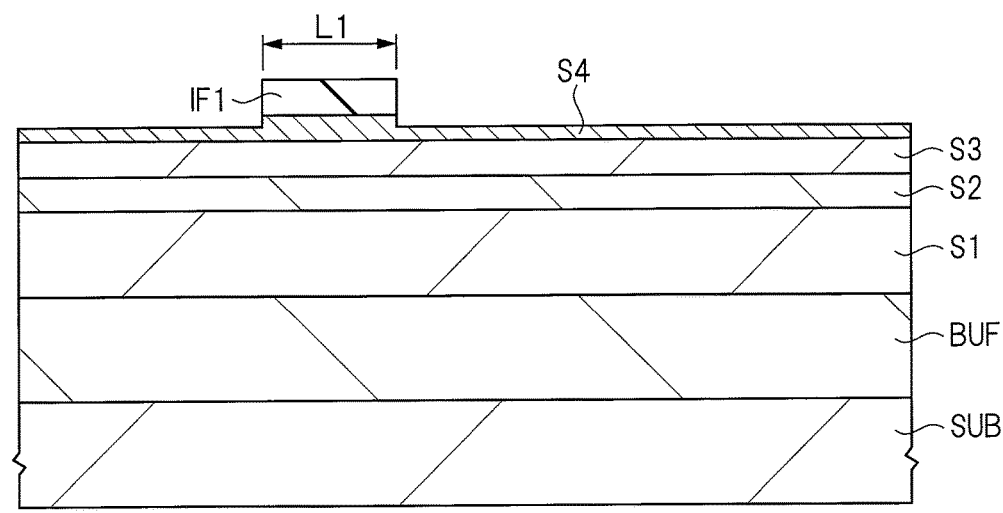
FIG. 46 is a cross-sectional view showing a manufacturing step of the semiconductor device of the sixth embodiment.
Figure 46:
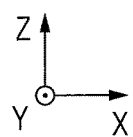

Next, as shown in FIG. 46, the fourth nitride semiconductor layer S4 is half-etched by using the insulating film IF1 as a mask. For example, the fourth nitride semiconductor layer S4 is etched by, for example, a film thickness corresponding to ½ from its surface by a dry etching process using a chlorine-based gas.

Figure 47:
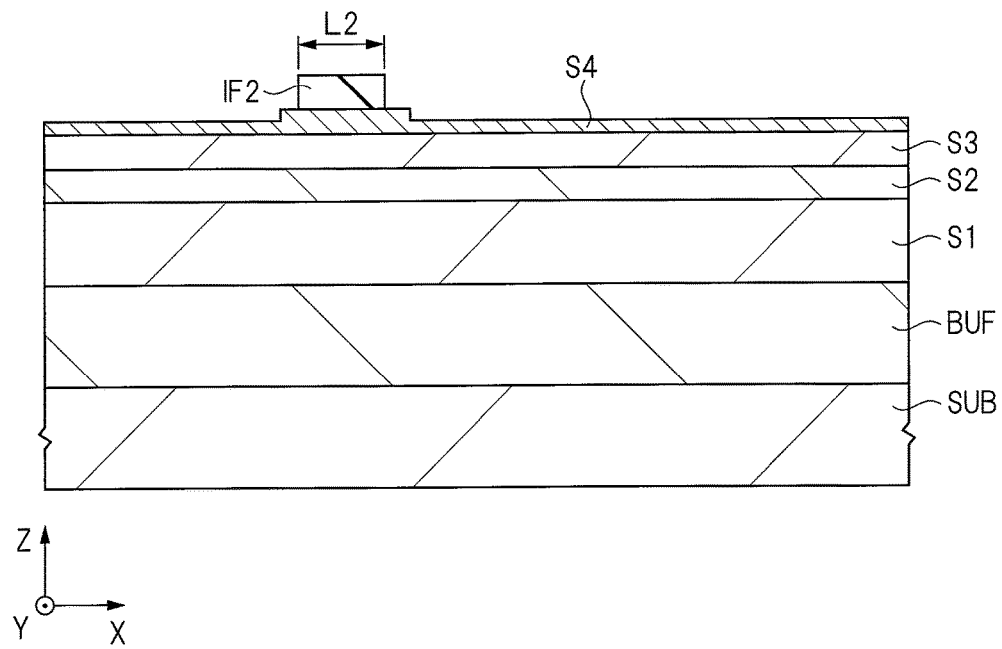
FIG. 47 is a cross-sectional view showing a manufacturing step of the semiconductor device of the sixth embodiment.

Next, by etching the insulating film IF1, an insulating film IF2 having a size that is slightly smaller than the insulating film IF1 is formed (FIG. 47). Note that the insulating film IF2 having a desired size may be reformed by removing the insulating film IF1. By this process, the insulating film IF2 can be formed so as to have a length L2 in the X direction that is smaller than a length (L1) of the insulating film IF1. The length (L1) of the insulating film IF1 in the X direction is set to, for example, about 4 μm, and the length (L2) of the insulating film IF2 in the X direction is set to, for example, about 2 μm.

Figure 48:
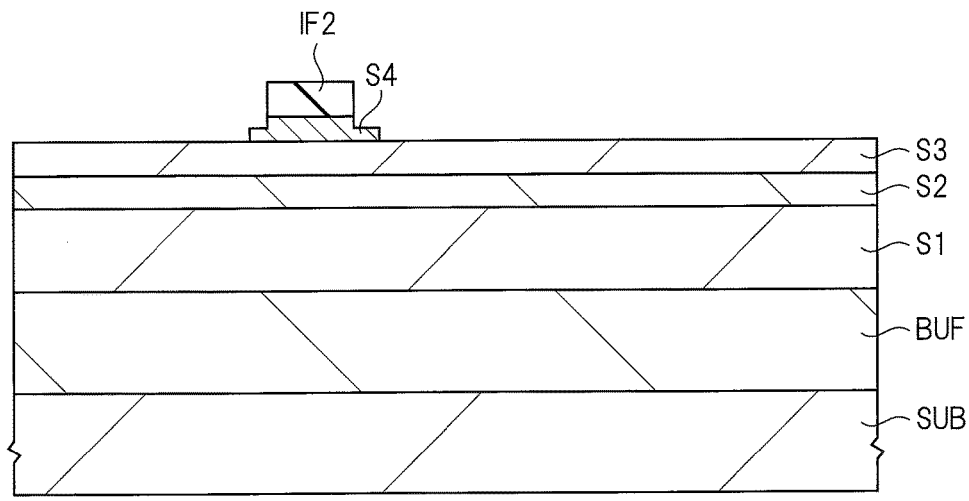
FIG. 48 is a cross-sectional view showing a manufacturing step of the semiconductor device of the sixth embodiment.

Next, as shown in FIG. 48, the fourth nitride semiconductor layer S4 is completely etched by using the insulating film IF2 as a mask until the third nitride semiconductor layer (electron supply layer) S3 is exposed.

In the half etching process and the complete etching process of the fourth nitride semiconductor layer S4, for example, an anisotropic dry etching process using a chlorine-based gas is performed. By these two etching processes, the two- or more-level step portion (the first film thickness portion and the second film thickness portion) can be formed on both ends of the fourth nitride semiconductor layer (cap layer) S4.

Figure 49:
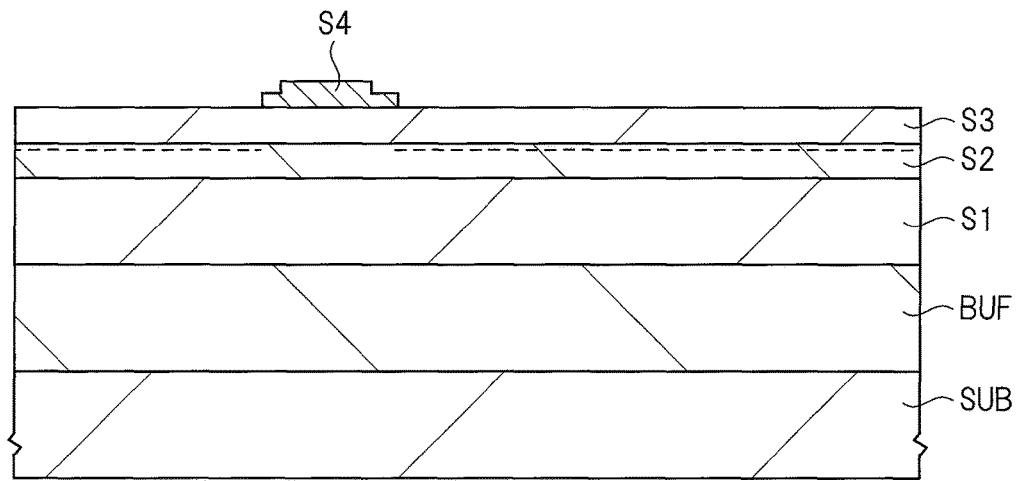
FIG. 49 is a cross-sectional view showing a manufacturing step of the semiconductor device of the sixth embodiment.

In the present embodiment, note that these two etching processes have been described as the example. However, a three- or more-level step portion may be formed by gradually reducing the size of the insulating film to be the mask and performing three or more etching processes. Then, the insulating film IF2 on the fourth nitride semiconductor layer S4 is removed (FIG. 49).

Figure 50:
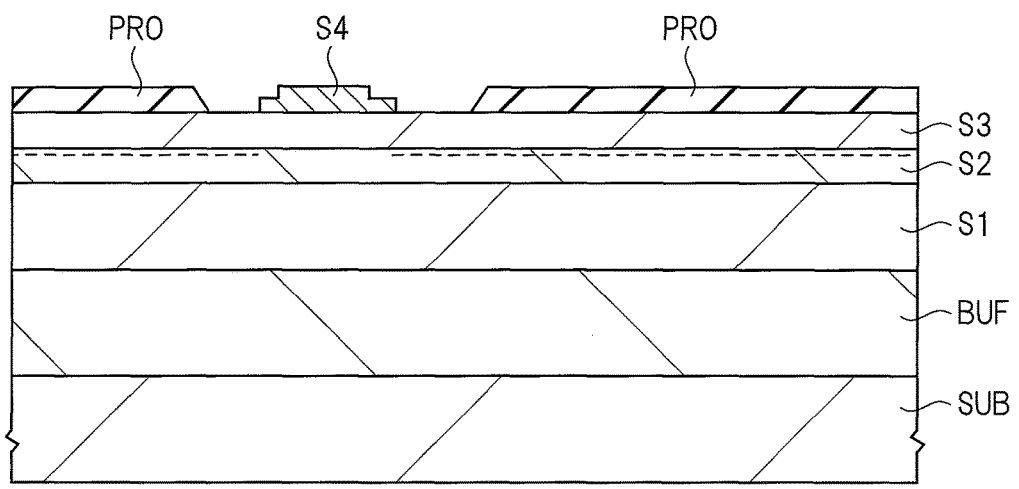
FIG. 50 is a cross-sectional view showing a manufacturing step of the semiconductor device of the sixth embodiment.

Next, as shown in FIG. 50, a surface protective layer PRO is formed on the fourth nitride semiconductor layer (cap layer) S4 and the third nitride semiconductor layer (electron supply layer) S3, and the surface protective film PRO on the fourth nitride semiconductor layer (cap layer) S4 is removed by etching. By this etching process, the side surface of the surface protective film PRO may be formed into a tapered shape as explained in the third embodiment in detail.

Next, as similar to the case of the first embodiment, a gate electrode GE is formed on the fourth nitride semiconductor layer (cap layer) S4 via a gate insulating film GI. Further, after an interlayer insulating film IL1 is formed, a source electrode SE and a drain electrode DE are formed (see FIG. 42).

By using the above-described processes, the semiconductor device of the present embodiment can be formed. Note that the above-described processes are described as one example. The semiconductor device of the present embodiment may be manufactured by using processes other than the above-described processes.

Moreover, in the above-described processes, the gate electrode GE, the source electrode SE and the drain electrode DE are formed by using so-called photolithography and etching techniques. However, these electrodes may be formed by using a so-called lift-off method as explained in the second embodiment.

Figure 51:
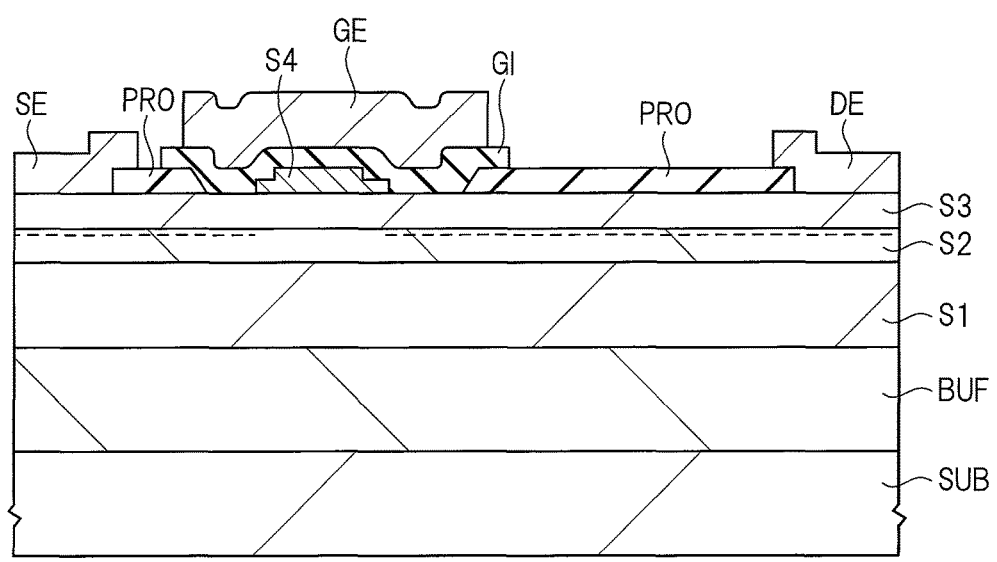
FIG. 51 is a cross-sectional view showing another configuration of the semiconductor device of the sixth embodiment.

FIG. 51 is a cross-sectional view showing another configuration of the semiconductor device of the present embodiment. Configurations except for the source electrode SE and the drain electrode DE are the same as those of the semiconductor device shown in FIG. 42.

In the present embodiment, the gate electrode GE is formed on the fourth nitride semiconductor layer (cap layer) S4 via a gate insulating film GI, and the surface protective film PRO is formed on both sides of the fourth nitride semiconductor layer (cap layer) S4. Moreover, the source electrode SE and the drain electrode DE are formed in parts on the third nitride semiconductor layer (electron supply layer) S3, the parts being on both sides of the fourth nitride semiconductor layer (cap layer) S4. For example, the surface protective film PRO in the formation regions of the source electrode SE and the drain electrode DE is removed, so that the third nitride semiconductor layer (electron supply layer) S3 is exposed. The source electrode SE and the drain electrode DE are formed on the exposed third nitride semiconductor layer (electron supply layer) S3.

The gate electrode GE, the source electrode SE and the drain electrode DE can be formed by using a lift-off method as similar to the case of the second embodiment.

Seventh Embodiment

In the above-described embodiments, the right and left shapes of the both ends of the fourth nitride semiconductor layer S4 are formed so as to be substantially symmetrical with each other. However, the shapes of the both ends of the fourth nitride semiconductor layer S4 may be formed so that the shapes closer to the source electrode and the drain electrode are different from each other.

FIRST APPLICATION EXAMPLE

Figure 52:
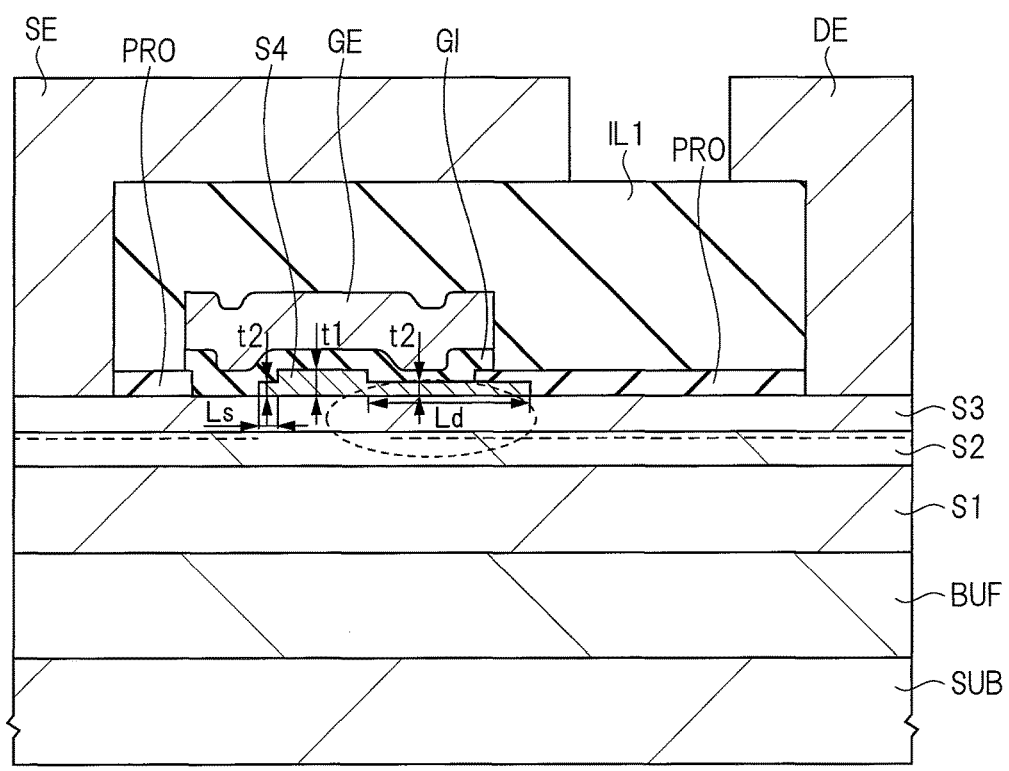
FIG. 52 is a cross-sectional view showing a configuration of a semiconductor device of a first application example of a seventh embodiment.
Figure 52:
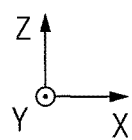

FIG. 52 is a cross-sectional view showing a configuration of a semiconductor device of the first application example of the present embodiment. In the sixth embodiment (FIG. 42), the sizes of the second film thickness portions on the both ends of the fourth nitride semiconductor layer (cap layer) S4 are formed to be substantially the same as each other. However, the lengths of them in the X direction may be different from each other.

As shown in FIG. 52, in the semiconductor device of the present embodiment, a length "Ld" of the second film thickness portion (the portion having the film thickness t2) in the X direction on the end portion of the fourth nitride semiconductor layer (cap layer) S4, the end portion being closer to the drain electrode DE, is larger than a length "Ls" of the second film thickness portion (the portion having the film thickness t2) in the X direction on the end portion of the same, the end portion being closer to the source electrode SE (Ld>Ls, see a circular portion indicated by a broken line in the drawing). In this case, "the length in the X direction" means a length in a gate length direction.

Figure 53:
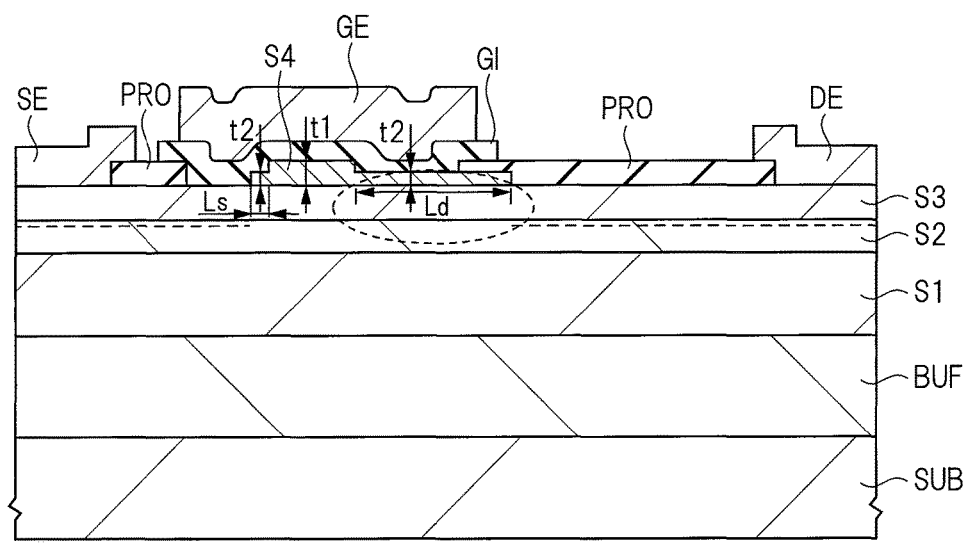
FIG. 53 is a cross-sectional view showing another configuration of the semiconductor device of the first application example of the seventh embodiment.
Figure 53:
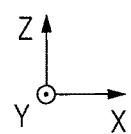

The length Ld of the second film thickness portion (the portion having the film thickness t2) in the X direction in the mesa type fourth nitride semiconductor layer (cap layer) S4, the second film thickness portion being closer to the drain electrode, is large, and therefore, the concentration of the two-dimensional electron gas (2DEG) below the second film thickness portion is lowered, so that an extreme change in the potential is moderated. In other words, the density of equipotential lines is moderated, so that a local concentration of the electric field is further moderated. Also in the present application example, note that the gate electrode GE, the source electrode SE and the drain electrode DE may be formed by using a lift-off method. FIG. 53 is a cross-sectional view showing another configuration of the semiconductor device of the first application example of the present embodiment.

The semiconductor device of the present embodiment can be formed by the same processes as those of the sixth embodiment. For example, for processing processes of the fourth nitride semiconductor layer (cap layer) S4, the following steps can be exemplified. For example, an insulating film (IF1) is formed in the formation region of the first film thickness portion (the portion having the film thickness t1), and the fourth nitride semiconductor layer S4 is half-etched by using the insulating film as a mask, and then, the insulating film (IF1) is removed. Next, an insulating film (IF2) is formed in the formation regions of the first film thickness portion (the portion having the film thickness t1) and the second film thickness portion (the portion having the film thickness t2), and the fourth nitride semiconductor layer S4 is complete-etched by using the insulating film as a mask, and then, the insulating film (IF2) is removed.

SECOND APPLICATION EXAMPLE

Figure 54:
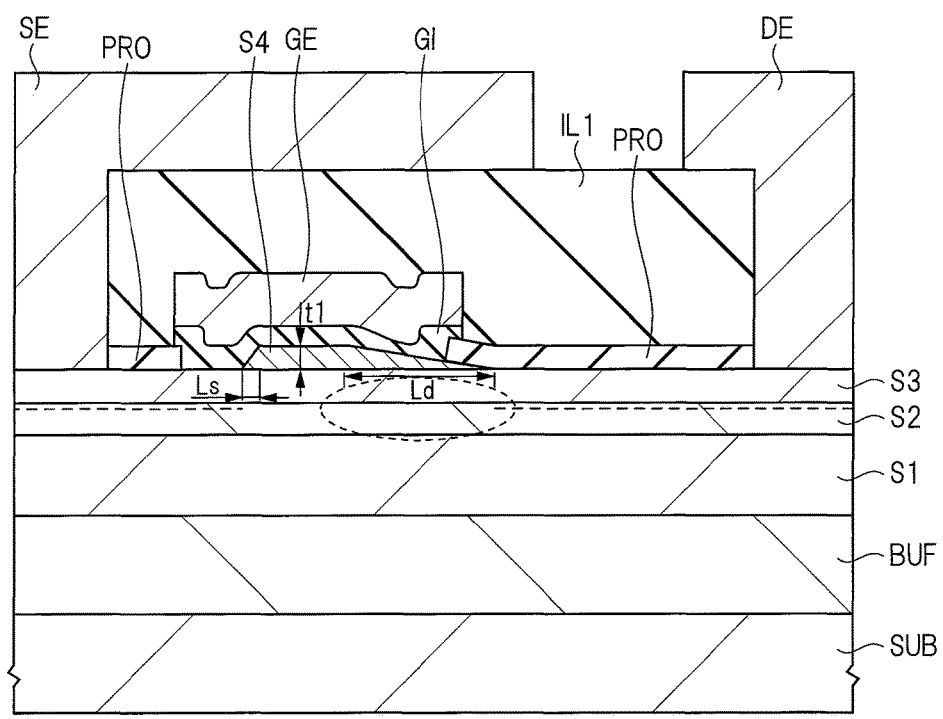
FIG. 54 is a cross-sectional view showing a configuration of a semiconductor device of a second application example of the seventh embodiment.

FIG. 54 is a cross-sectional view showing a configuration of a semiconductor device of a second application example of the present embodiment. In the first embodiment (FIG. 1), the tapered shapes of the both side surfaces of the fourth nitride semiconductor layer (cap layer) S4 are formed to have the same shape as each other. However, the shapes may be made different from each other.

As shown in FIG. 54, in the semiconductor device of the present embodiment, the length Ld of the tapered portion in the X direction in the fourth film thickness portion (cap layer) S4, the tapered portion being closer to the drain electrode DE, is larger than the length Ls of the tapered portion in the X direction therein, the tapered portion being closer to the source electrode SE (Ld>Ls, see a circular portion indicated by a broken line in the drawing). "The length of the tapered portion in the X direction" means a distance from the end of the first film thickness portion (the portion having the film thickness t1) to the end of the fourth nitride semiconductor layer (cap layer) S4. In other words, the length in the gate length direction when viewed from the upper surface of the side surface closer to the drain electrode DE is larger than the length in the gate length direction when viewed from the upper surface of the side surface closer to the source electrode SE. In this manner, the inclination of the side surface closer to the drain electrode DE may be moderated. In this case, the taper angle of the side surface closer to the drain electrode is larger than the taper angle of the side surface closer to the source electrode.

Since the length of the tapered portion in the X direction in the mesa type fourth nitride semiconductor layer (cap layer) S4, the tapered portion being closer to the drain electrode, is large, the density of the two-dimensional electron gas (2DEG) below the tapered portion is smaller as the thickness of the tapered portion is larger, so that an extreme change in the potential is moderated. In other words, the density of equipotential lines is moderated, so that the local concentration of the electric field is more moderated than that of the first application example. The semiconductor device of the present embodiment can be formed by using the same processes as those of the sixth embodiment. For example, the side surface closer to the drain electrode DE and the side surface closer to the source electrode SE may be formed by using different etching conditions from each other.

Figure 55:
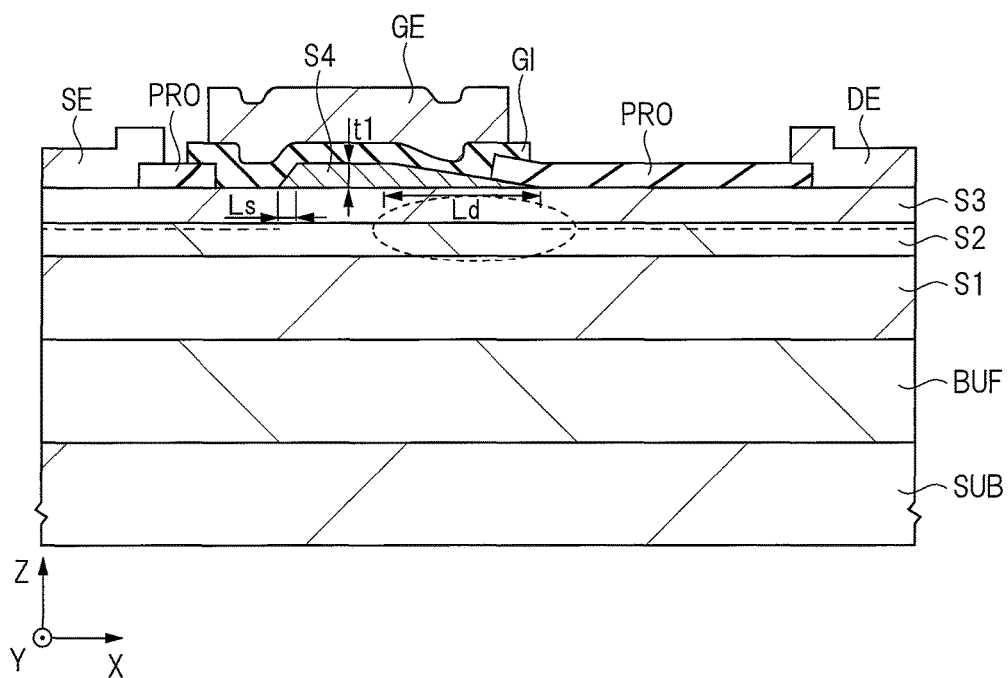
FIG. 55 is a cross-sectional view showing another configuration of the semiconductor device of the second application example of the seventh embodiment.

Also in the present application example, note that the gate electrode GE, the source electrode SE and the drain electrode DE may be formed by using a lift-off method. FIG. 55 is a cross-sectional view showing another configuration of the semiconductor device of the second application example of the present embodiment.

In the foregoing, the invention made by the present inventors has been concretely described based on the embodiments. However, it is needless to say that the present invention is not limited to the foregoing embodiments and various modifications and alterations can be made within the scope of the present invention.

What is claimed is:

1. A semiconductor device comprising:
   a first nitride semiconductor layer;
   a second nitride semiconductor layer formed on the first nitride semiconductor layer;

a third nitride semiconductor layer formed on the second nitride semiconductor layer;
a fourth nitride semiconductor layer of a mesa type formed on the third nitride semiconductor layer;
a source electrode formed in a part on the third nitride semiconductor layer, the part being closer to one side of the fourth nitride semiconductor layer;
a drain electrode formed in a part on the third nitride semiconductor layer, the part being closer to the other side of the fourth nitride semiconductor layer;
a gate insulating film covering the fourth nitride semiconductor layer; and
a gate electrode formed on the gate insulating film,
wherein an electron affinity of the second nitride semiconductor layer is equal to or larger than an electron affinity of the first nitride semiconductor layer,
an electron affinity of the third nitride semiconductor layer is smaller than an electron affinity of the first nitride semiconductor layer,
an electron affinity of the fourth nitride semiconductor layer is equal to or larger than an electron affinity of the second nitride semiconductor layer,
the fourth nitride semiconductor layer and the gate electrode are separated from each other by the gate insulating film, and
a film thickness of the fourth nitride semiconductor layer is gradually reduced at an end portion closer to the drain electrode.

2. The semiconductor device according to claim 1, wherein a film thickness of the fourth nitride semiconductor layer is gradually reduced at an end portion closer to the source electrode.

3. The semiconductor device according to claim 2, wherein the fourth nitride semiconductor layer of the mesa type has an upper surface, a side surface closer to the drain electrode and a side surface closer to the source electrode, and
the side surface closer to the drain electrode has a tapered shape, and
an angle made by the third nitride semiconductor layer and the side surface closer to the drain electrode is equal to or larger than 120 degrees.

4. The semiconductor device according to claim 3, wherein the side surface closer to the source electrode has a tapered shape, and
an angle made by the third nitride semiconductor layer and the side surface closer to the source electrode is equal to or larger than 120 degrees.

5. The semiconductor device according to claim 4, wherein the angle made by the third nitride semiconductor layer and the side surface closer to the drain electrode is larger than the angle made by the third nitride semiconductor layer and the side surface closer to the source electrode.

6. The semiconductor device according to claim 4, wherein a length in a gate length direction when viewed from an upper surface of the side surface closer to the drain electrode is larger than a length in the gate length direction when viewed from an upper surface of the side surface closer to the source electrode.

7. The semiconductor device according to claim 4, further comprising:
a first insulating film formed in a part on the third nitride semiconductor layer, the part being closer to the drain electrode of the fourth nitride semiconductor layer; and
a second insulating film formed in a part on the third nitride semiconductor layer, the part being closer to the source electrode of the fourth nitride semiconductor layer.

8. The semiconductor device according to claim 7, wherein the gate insulating film extends from an upper portion of the first insulating film to an upper portion of the second insulating film.

9. The semiconductor device according to claim 8, wherein a side surface of the first insulating film, the side surface overlapping with the gate insulating film, has a tapered shape.

10. The semiconductor device according to claim 9, wherein a side surface of the second insulating film, the side surface overlapping with the gate insulating film, has a tapered shape.

11. The semiconductor device according to claim 2, wherein an end portion of the fourth nitride semiconductor layer of the mesa type, the end portion being closer to the drain electrode, has a first film thickness portion and a second film thickness portion,
the second film thickness portion is outside the first film thickness portion, and
a film thickness of the second film thickness portion is smaller than a film thickness of the first film thickness portion.

12. The semiconductor device according to claim 11, wherein an end portion of the fourth nitride semiconductor layer of the mesa type, the end portion being closer to the source electrode, has a third film thickness portion and a fourth film thickness portion,
the fourth film thickness portion is outside the third film thickness portion, and
a film thickness of the third film thickness portion is smaller than a film thickness of the fourth film thickness portion.

13. The semiconductor device according to claim 12, wherein a length of the first film thickness portion in a gate length direction is larger than a length of the third film thickness portion in the gate length direction.

14. The semiconductor device according to claim 12, further comprising:
a first insulating film formed in a part on the third nitride semiconductor layer, the part being closer to the drain electrode of the fourth nitride semiconductor layer; and
a second insulating film formed in a part on the third nitride semiconductor layer, the part being closer to the source electrode of the fourth nitride semiconductor layer.

15. The semiconductor device according to claim 14, wherein the gate insulating film extends from an upper portion of the first insulating film to an upper portion of the second insulating film.

16. The semiconductor device according to claim 15, wherein a side surface of the first insulating film, the side surface overlapping with the gate insulating film, has a tapered shape.

17. The semiconductor device according to claim 16, wherein a side surface of the second insulating film, the side surface overlapping with the gate insulating film, has a tapered shape.

* * * * *